United States Patent
Suarez et al.

(10) Patent No.: US 10,141,227 B1
(45) Date of Patent: Nov. 27, 2018

(54) METHOD AND SYSTEM FOR ACHIEVING SEMICONDUCTOR-BASED CIRCUITS OR SYSTEMS HAVING MULTIPLE COMPONENTS WITH ONE OR MORE MATCHED OR SIMILAR CHARACTERISTICS OR FEATURES

(71) Applicant: NXP USA, Inc., Austin, TX (US)

(72) Inventors: Jose Luis Suarez, Chandler, AZ (US); Gabriela Michel Sanchez, Zapopan (MX); Audel Sanchez, Tempe, AZ (US); Michele Lynn Miera, Gilbert, AZ (US); Flavio Hernandez Rodriguez, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/649,799

(22) Filed: Jul. 14, 2017

(51) Int. Cl.
| | |
|---|---|
| *H01L 21/82* | (2006.01) |
| *H05K 13/04* | (2006.01) |
| *H01L 21/67* | (2006.01) |
| *H01L 21/68* | (2006.01) |

(52) U.S. Cl.
CPC ........ *H01L 21/82* (2013.01); *H01L 21/67259* (2013.01); *H01L 21/68* (2013.01); *H05K 13/0404* (2013.01); *H01L 2223/54466* (2013.01)

(58) Field of Classification Search
CPC ... H01L 21/82; H01L 21/67259; H01L 21/68; H01L 2223/54466; H05K 13/0404
See application file for complete search history.

(56) References Cited

U.S. PATENT DOCUMENTS

| | | | |
|---|---|---|---|
| 5,838,951 A | 11/1998 | Song | |
| 7,243,325 B2 | 7/2007 | McIntyre et al. | |
| 9,419,566 B2 | 8/2016 | Noori et al. | |
| 2010/0047053 A1* | 2/2010 | Burke | H01L 21/67144 |
| | | | 414/787 |

FOREIGN PATENT DOCUMENTS

| | | |
|---|---|---|
| JP | H1092882 A | 4/1998 |
| JP | 2963328 B2 | 10/1999 |

* cited by examiner

*Primary Examiner* — Julia Slutsker

(57) ABSTRACT

Methods and systems for achieving semiconductor-based circuits or systems having multiple components with one or more matched or similar characteristics or features are disclosed herein. In one example embodiment, a system includes a processing device that includes first, second, and third circuitry. The first circuitry is configured to generate control signals that at least indirectly cause a pick and place head mechanism to attempt to pick up and place at least some of first and second dice. The second circuitry is configured to assess whether attempts to implement one or more of first and second dice should be skipped based upon wafer map information. Further, the third circuitry is configured to determine whether a second position of a first one of the second dice is sufficiently proximate to a first position so that it would be appropriate to implement the first one of the second dice.

18 Claims, 12 Drawing Sheets

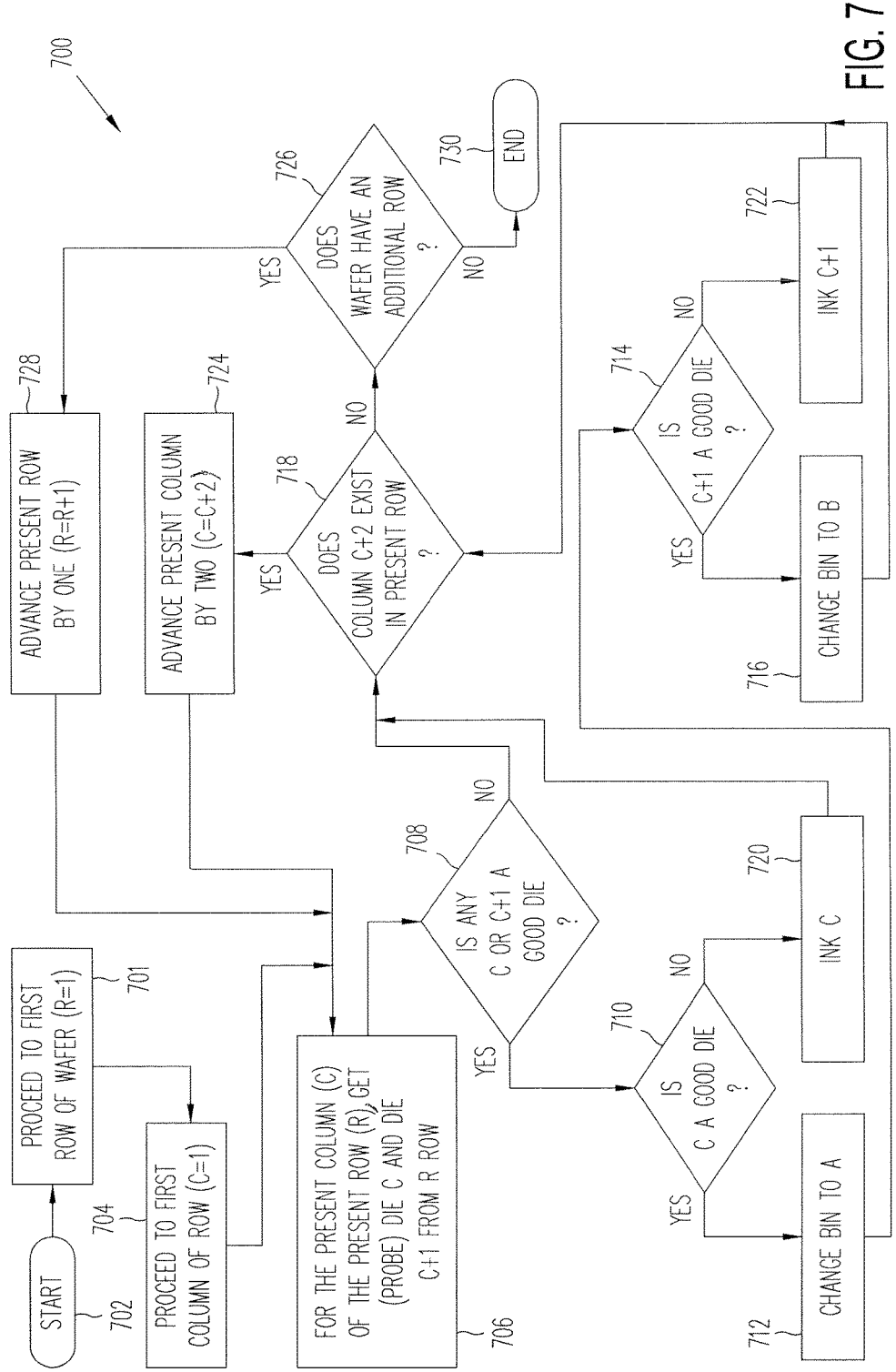

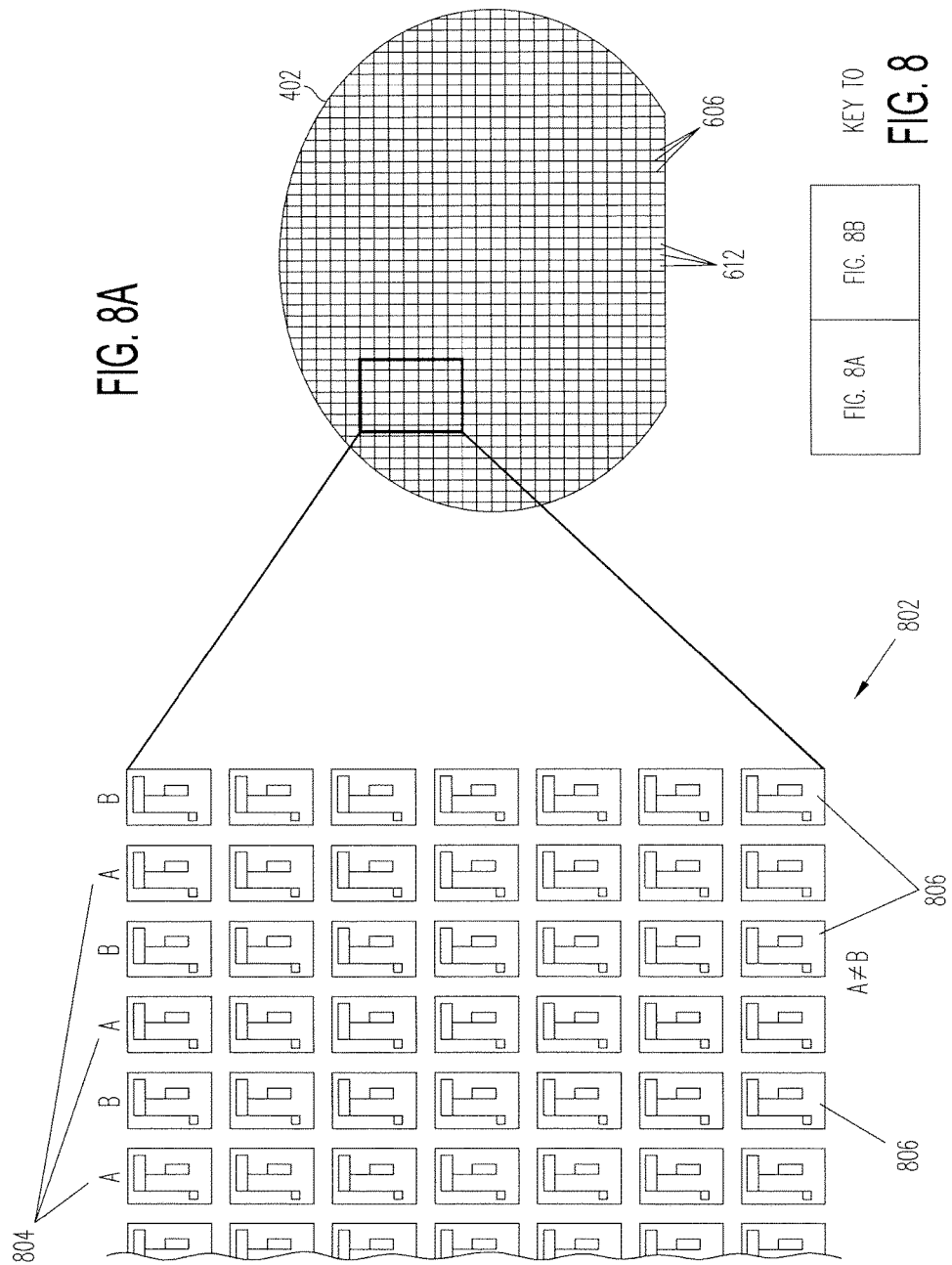

KEY TO

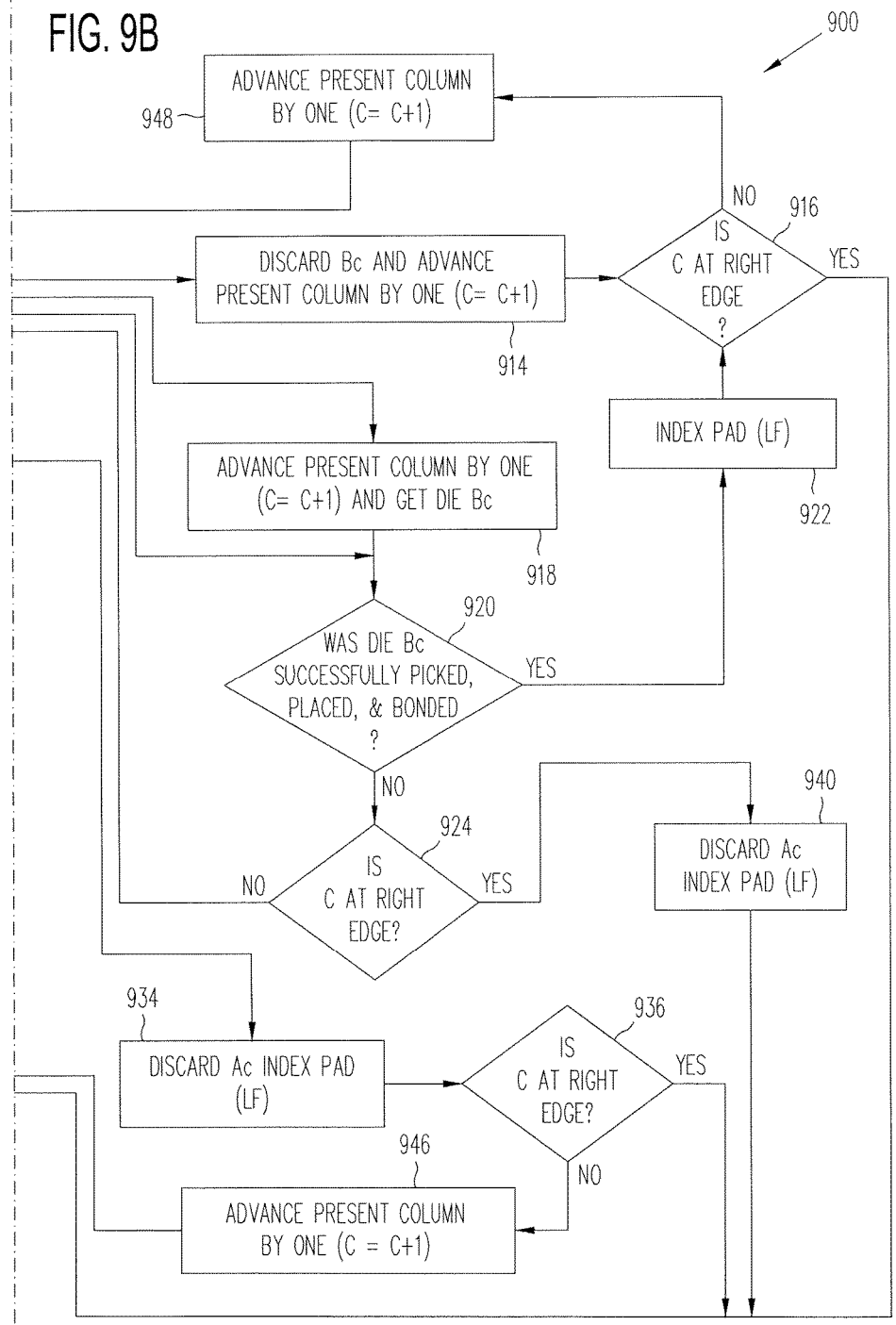

METHOD AND SYSTEM FOR ACHIEVING SEMICONDUCTOR-BASED CIRCUITS OR SYSTEMS HAVING MULTIPLE COMPONENTS WITH ONE OR MORE MATCHED OR SIMILAR CHARACTERISTICS OR FEATURES

CROSS-REFERENCE TO RELATED APPLICATIONS

- - -

STATEMENT REGARDING FEDERALLY SPONSORED RESEARCH OR DEVELOPMENT

- - -

FIELD OF THE DISCLOSURE

The present disclosure relates to methods and systems for assembling, fabricating, or otherwise achieving semiconductor-based circuits or systems and, more particularly, semiconductor-based circuits or systems using multiple dice that provide multiple components having one or more matched or similar characteristics or features.

BACKGROUND OF THE DISCLOSURE

Many semiconductor-based circuits or systems have designs in which there is a need for multiple components that are matched or otherwise similar with one another in terms of one of more component characteristics or features, including (for example) electrical parameters or characteristics. For example, multi-path amplifier circuits may employ multiple amplifier circuit sections that, to achieve desired performance of the overall amplifier circuit, should be substantially identical in some aspects of electrical performance. One manner of achieving such semiconductor-based circuits or systems with multiple matched or otherwise-similar components is to fabricate such circuits or systems using multiple dice that respectively serve as the multiple matched components, respectively, where the multiple dice are obtained during fabrication from the same wafer or closely-related semiconductor wafers.

However, the use of multiple dice from the same wafer or closely-related wafers does not necessarily guarantee that the multiple dice or components provided thereby will exhibit characteristics or features that are sufficiently matched or similar. To the contrary, wafer processing often produces dice that (or have films that) vary significantly physically, such as in thickness, or have significant gradients, such as with respect to chemical vapor deposition. Consequently, components provided by different dice formed on the same wafer or closely-related wafers will often naturally exhibit significantly different electrical parameters or other characteristics or features relative to one another. Indeed, wafer variations that can significantly affect component characteristics and features occur not only on a lot-to-lot basis, or on a wafer-to-wafer basis, but also even within a single wafer.

Consequently, to achieve semiconductor-based circuits or systems with multiple components that are sufficiently matched or similar using dice provided from the same wafer or closely-related wafers, it is important that the dice be selected and implemented in a manner that enhances the likelihood that the dice, and components provided thereby, will exhibit the desired characteristics or features. To some extent, such selection and implementation naturally involves some discarding of certain dice because the dice are not sufficiently matched or similar relative to other dice, or because certain dice have characteristics or features that render those dice unusable. Yet it nevertheless is desirable when manufacturing semiconductor-based circuits and systems by way of dice provided from wafers that the proportion of potentially-usable dice on the wafers that are implemented be increased, and that the proportion of potentially-usable dice on the wafers that are discarded be decreased.

For at least these reasons, therefore, it would be advantageous if new or improved methods or systems could be developed for assembling, fabricating, or otherwise achieving semiconductor-based circuits or systems using multiple dice to provide multiple components having one or more matched or similar characteristics or features, in manners that enhanced the proportion of potentially-usable dice that were implemented and not discarded so as to achieve higher efficiency or lower cost objectives, or that met one or more other objectives.

BRIEF DESCRIPTION OF THE DRAWINGS

FIG. 7 is an additional flow chart illustrating steps of an example method that is employed as part of the method shown in FIG. 6 (e.g., a subprocess encompassed by the method of FIG. 6) to develop a map identifying dice that can be implemented, or may not be suitable for implementation, into a circuit or system in accordance with the method of FIG. 6;

DETAILED DESCRIPTION

Figure 1:
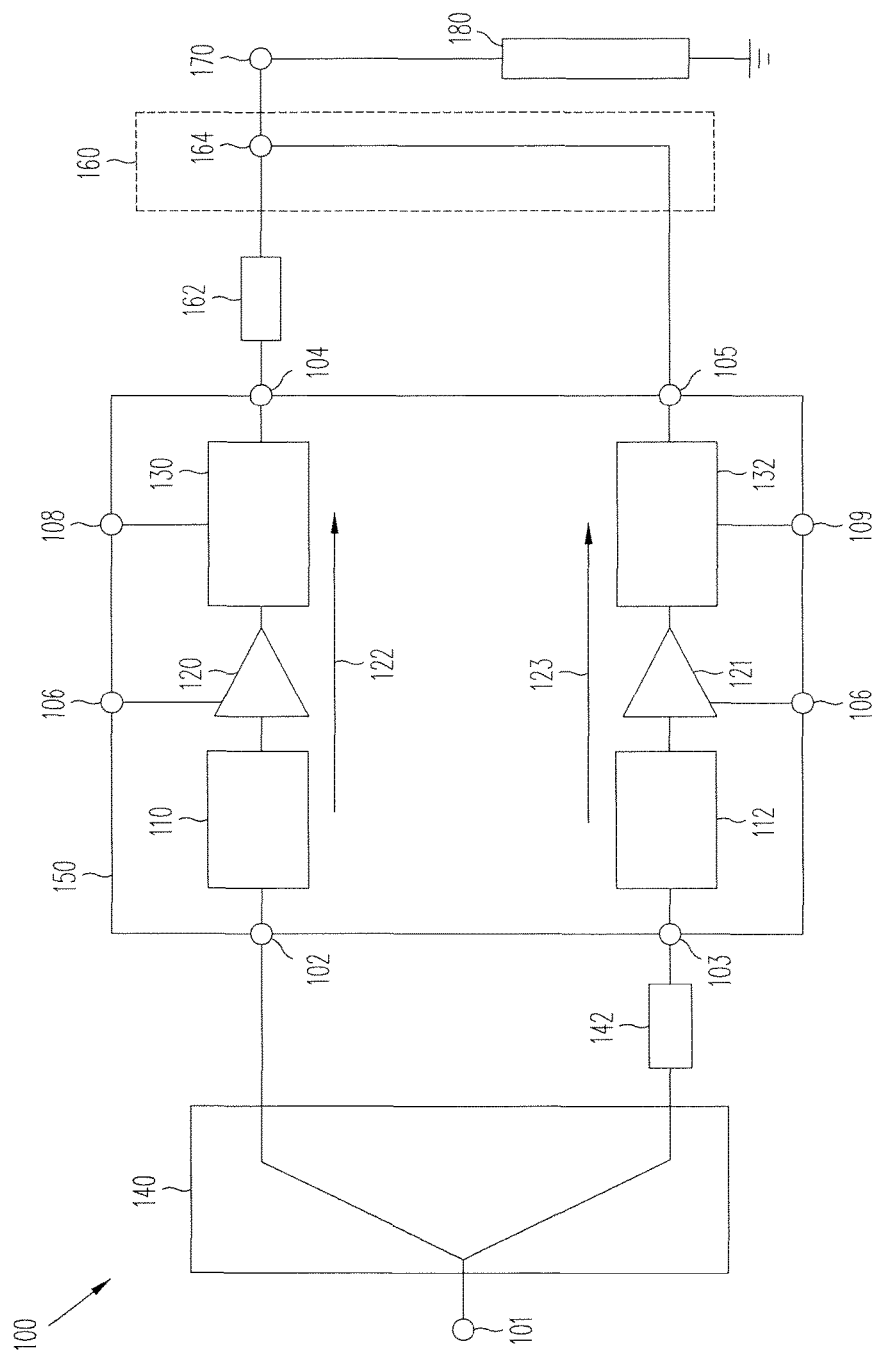
FIG. 1 is a schematic diagram showing an example amplifier system having multiple matched (or similar) components provided through the implementation of multiple matched (or similar) dice in accordance with one or more of the systems or methods described herein.

The present disclosure encompasses a variety of embodiments of methods and systems for achieving semiconductor-based circuits or systems having multiple components with one or more matched or similar characteristics or features. Such embodiments employ new electronic wafer mapping techniques that enable device assembly utilizing dice from the same semiconductor wafer, in combination with new die selection, assembly, and/or implementation techniques during the die sorting and/or the die bonding (or picking and placing) process. In at least some such embodiments, two or more distinct die designs are formed on a given wafer, associated groups of such distinct die designs that have matching or similar characteristics or features are mapped, and groups of two or more associated dice of the different distinct die designs are implemented in the formation of a system or circuit, so that matched or similar components are added to (or form) the system or circuit. Accordingly, embodiments encompassed herein serve to enhance semiconductor assembly of different die designs within the same wafer. As used herein, the term "implement a dice" (and similar terms), when used in the context of forming a system or circuit, means to position the dice in a desired physical location (e.g., on a flange, PCB, or other substrate) in relation to or within the system or circuit, including moving the dice from a location within a singulated wafer to the desired location in relation to or within the system or circuit. In some embodiments or circumstances, the term "implement a dice" (and similar terms) can also include additional operations or aspects including attaching or bonding (or taking actions intended to facilitate attaching or bonding) the dice at a desired physical location in relation to or within the system or circuit, although this is not the case in all embodiments or circumstances. In addition, the term "semiconductor system" may mean a semiconductor device or assembled circuit, or an arrangement of semiconductor die in an intermediate step during the formation of a semiconductor device or assembled circuit (e.g., an arrangement of semiconductor die on a temporary substrate or carrier of some type).

In at least some embodiments encompassed herein, the methods and systems achieve desired levels of matching or similar characteristics or features in components by identifying and implementing, into a given system or circuit (e.g., onto a substrate on which such system or circuit is being formed, or onto an intermediate or temporary substrate), multiple dice that have identical or similar semiconductor characteristics or features. In some such embodiments, dice that have identical or similar characteristics or features are ones that are near or adjacent to one another—that is, matched or similar circuits or systems are attained by maximizing the proximity or adjacency of the dice that are selected and implemented for forming the circuits or systems. The use of such methods and systems in at least some embodiments maximizes, or facilitates achievement of, die parity at a product level. The ultimate systems and circuits (or devices) resulting from these methods and systems are enhanced in terms of performance or other characteristics by eliminating, or reducing, die-to-die, wafer-to-wafer, and lot-to-lot variations between dice and associated components.

The particular characteristics or features that are of interest from the standpoint of matching or similarity can vary depending upon the embodiment or circumstances. In at least some embodiments, it is desirable to achieve circuits or systems that have components that are matched or similar in terms of electrical performance. To achieve this, at least some embodiments herein operate to identify and implement dice (or films) that have identical or similar physical characteristics, such as in terms of thickness of the dice or various constituent material layers of the dice (e.g., dielectric or other layers), or have significant gradients, such as with respect to chemical vapor deposition (or in terms of film depositions or implant characteristics). Such characteristics in turn can influence electrical parameters of the components provided by those dice, such as the thicknesses of various dielectric layers, breakdown voltages, on-resistance parameters, and other parameters, features, or characteristics. It should be appreciated that, if components are identical or similar in regard to one or more characteristics or features, those components need not be identical or similar in regard to other characteristics or features. For example, two components can have identical breakdown voltages but have different physical sizes. Also, two or more dice that are matched or similar (or components provided by such dice that are matched or similar) can have the same footprint, but possibly can include transistors of different sizes, or transistors with more or different numbers of rows of interdigitated fingers or different layouts or configuration aspects.

In at least some embodiments, the present disclosure relates to methods for semiconductor assembly that employ groups of two adjacent dice, that is pairs of adjacent dice. The methods utilize electronic wafer mapping and assembly techniques that enable device assembly from a semiconductor wafer having two distinct die designs maintaining maximum die parity. One aspect of the methods involves a wafer mask method according to which a group of dice (e.g., a pair of dice, such as can provide a peaking amplifier and a main or carrier amplifier) is provided in which the different dice have the same X, Y dimensions but have internal design differences. In such method, a wafer is unit probed (tested) in a single pass to maintain compatibility with the probe process, and an electronic wafer map (SEMI E142) is set up in such a manner that each row has an even number of dice and always begins with a die A and ends at a die B so as to maintain one-hundred percent (100%) parity integrity across the entire wafer space. To enable this e-mapping methodology (die pairing), a post-processing algorithm was developed to ensure good pairs are generated so as to maintain the integrity of each of probe results, inspections screening, probe optimizations algorithms (i.e., DPAT, GDBC (Good Die Bad Cluster), etc.), and preserving previous fail bin (data integrity), and then the dice are binned by type (e.g., peaking and carrier).

Further in such method, the paired die electronic wafer map (SEMI E142) is then utilized as a basis for driving or controlling a die bonder or other assembly machine (e.g., a pick and place machine, a die sorting machine, one or more other pieces of equipment configured to move multiple singulated and arranged semiconductor die from one location to another, etc.) that operates according to additional programming (or algorithms) that control the assembly process in manners that achieve high machine throughput and high (or maximized) die parity. By virtue of this method, the potential impact of wafer variations as a source of component performance variations, which are known to impact design applications, circuits, or systems where multiple die are in use (for example, in multi-path amplifiers such as Doherty amplifiers), is reduced. Accordingly, the manufacturability of such design applications, circuits, or systems using different dice from the same wafer is enhanced, and adjacent dice can be utilized for the assembly of such design applications, circuits, or systems with less (or no) concern that wafer-to-wafer, lot-to-lot, or within-wafer variations will negatively impact performance. Thus, circuits or systems employing components having desired levels of component matching or similarity, in terms semiconductor characteristics or features, can be achieved, and additionally part-to-part variation can be reduced or minimized.

Referring to FIG. 1, a simplified block diagram is provided to illustrate an amplifier system 100 that employs multiple (in this example, two) electrical components that are matched or otherwise similar. In this example, the system 100 is a Doherty power amplifier, although this is merely an example of many circuits or systems that can employ multiple matched, or otherwise-similar, electrical components that are intended to be encompassed herein. As shown, the system 100 includes an input node 101, an output node 170, a power divider 140, an RF amplifier device 150, and a power combiner 160. The power divider 140 is coupled between input node 101 and input terminals 102, 103 to the RF amplifier device 150, and the power combiner 160 is coupled between output terminals 104, 105 of the RF amplifier device 150 and output node 170. An input signal received at input node 101 is amplified by the amplifier system 100 and provided to a load 180 via the output node 170.

More specifically, during operation, the power divider 140 is configured to divide the power of the input signal received at the node 101 into multiple portions (e.g., equal portions) of the input signal, where respective portions of the input signal are provided to the input terminals 102, 103. For example, a first output of the power divider 140 may be coupled to the input terminal 102 corresponding to a first amplifier path 122, which can also be referred to as a main amplifier path. Also for example, a second output of the power divider 140 may be coupled to the input terminal 103 corresponding to a second amplifier path 123, which can also be referred to as a peaking amplifier path. The power divider 140 may divide the input power equally among the amplifier paths 122, 123, such that roughly half of the input signal power is provided to each of the amplifier paths 122, 123. Alternatively, the power divider 140 can divide the power unequally.

The amplifier system 100 includes a first phase inversion element 142 between the second output of the power divider 140 and the input terminal 103 corresponding to the peaking amplifier path 123. For example, the first phase inversion element 142 can be implemented as a quarter wave transmission transformer (e.g., a 90° phase length transmission line) or a lumped element implementation of a 90° phase transformer. The amplifier system 100 also includes a second phase inversion element 162 between the output terminal 104 corresponding to the main amplifier path 122 and a summing node 164 of the power combiner 160. The output terminal 105 for the peaking amplifier path 123 also is coupled to the summing node 164. As with the first phase inversion element 142, the second phase inversion element 162 may be implemented as a quarter wave transmission transformer (e.g., a 90° phase length transmission line) or a lumped element implementation of a 90° phase transformer. The combination of phase inversion elements 142, 162 ensures that the currents ultimately provided to the summing node 164 by the respective amplifier paths 122, 123 are provided substantially in-phase with each other. Accordingly, the current provided by summing node 164 to the output node 170 (and to the load 180) represents the in-phase summation of the currents provided by amplifier paths 122, 123.

In an alternate embodiment, positive and negative phase shifts can be applied along both of the amplifier paths 122, 123 at the input terminals of the device 150 to achieve approximately 90° of phase difference between the signals processed through the device 150 along the main and peaking amplifier paths 122, 123. Similarly, positive and negative phase shifts may be applied along both of the amplifier paths 122, 123 at the output terminals of the device 150 to ensure that the signals are combined in phase at the summing node 164. In another alternate embodiment, the amplifier system can be configured in an "inverted Doherty" configuration. In such a configuration, the input side phase inversion element is included at the input to the main amplifier path (rather than at the input to the peaking amplifier path), and the output side phase inversion element is included at the output of the peaking amplifier path (rather than at the output of the main amplifier path).

As already noted, the RF amplifier device 150 includes multiple amplifier paths, namely, the main amplifier path 122 and the peaking amplifier path 123. Each of the amplifier paths 122 and 123 respectively includes an input impedance matching circuit 110 and 112, respectively, an amplifier stage (or in some embodiments more than one such amplifier stage) 120 and 121, respectively, and an output impedance matching circuit 130 and 132, respectively. More particularly, as shown, the input impedance matching circuit 110, amplifier stage 120, and output impedance matching circuit 130 of the main amplifier path 122 are coupled in series with one another in between the input terminal 102 and the output terminal 104 of the device 150. Also as shown, the input impedance matching circuit 112, amplifier stage 121, and output impedance matching circuit 132 of the peaking amplifier path 123 are coupled in series with one another in between the input terminal 103 and the output terminal 105 of the device 150. In addition, each amplifier stage 120, 121 can be coupled to a voltage reference plane (e.g., ground) through respective ones of a pair of terminals 106 (e.g., a conductive feature on a PCB or a flange).

Figure 2:
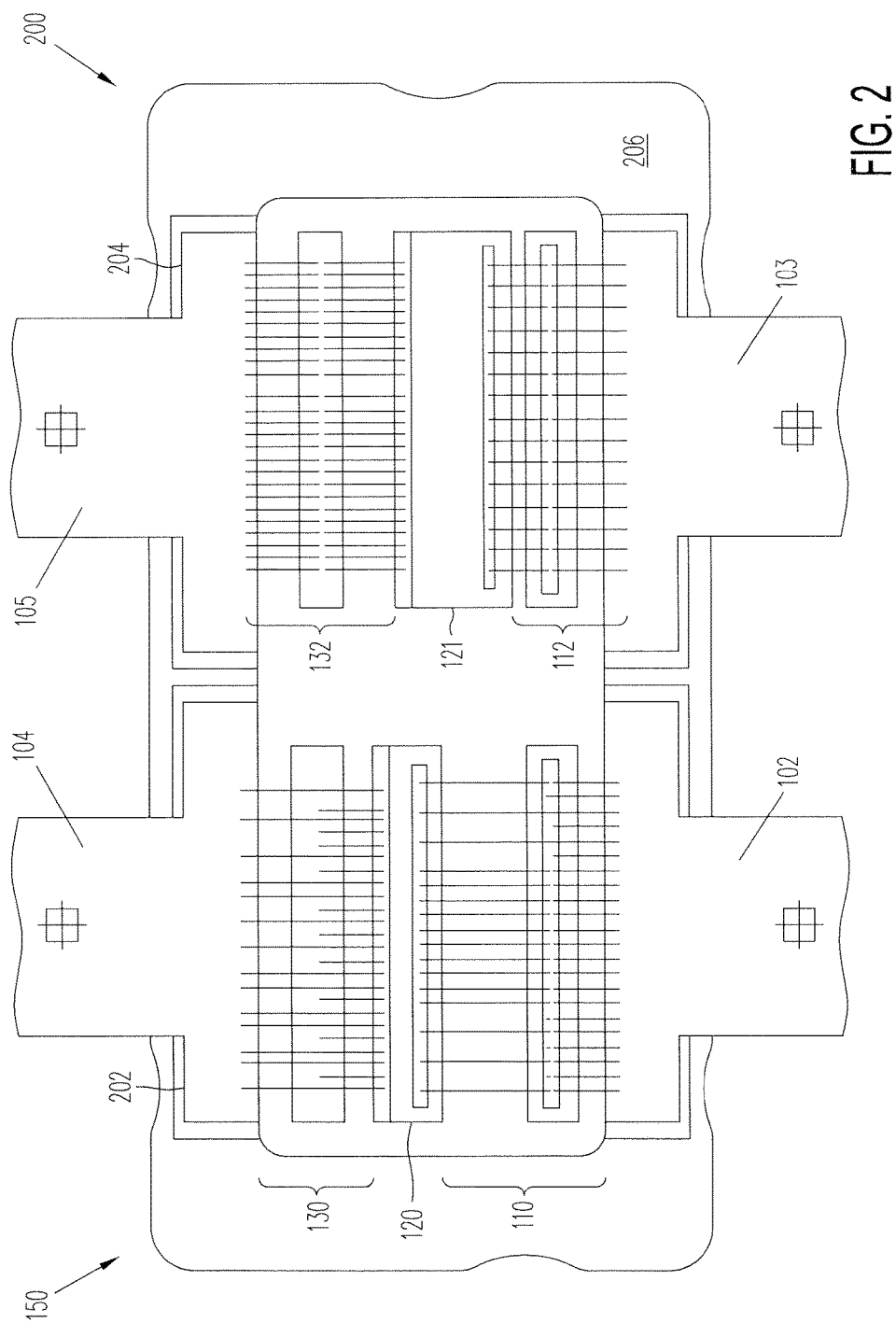
FIG. 2 is a top view of an integrated circuit (or a layout diagram) showing in more detail portions of the amplifier system of FIG. 1, particularly a RF amplifier device thereof.

Referring additionally to FIG. 2, a top view of an integrated circuit 200 (or a layout diagram) shows in more detail portions of the amplifier system 100 of FIG. 1 that form the RF amplifier device 150 thereof. The portions shown in FIG. 2 particularly are those portions of the amplifier system 100 that can be implemented by way of a first die 202 and a second die 204, which are both mounted on a copper flange 206, which can serve as a substrate. As described above and further shown as encompassed by the integrated circuit 200 of FIG. 2, the RF amplifier device 150 includes the components forming the main amplifier path 122, which are provided by the first die 202, and the components forming the peaking amplifier path 123, which are provided by the second die 203. It will be appreciated that the integrated circuit 200 of FIG. 2 can implemented onto a printed circuit board (PCB) on which other portions of the amplifier system 100 such as the power divider 140 and power combiner 160 would be present (such a PCB can also be considered to constitute or include a substrate).

More particularly as shown, the components forming the main amplifier path 122 include the amplifier stage 120, the output impedance matching circuit 130 coupled between the amplifier stage 120 and an associated output package lead forming the output terminal 104, and the input impedance matching circuit 110 coupled between the main amplifier stage 120 and an associated input package lead forming the input terminal 102. By comparison, the components forming the peaking amplifier path 123 include the amplifier stage 121, the output impedance matching circuit 132 coupled between the amplifier stage 121 and an associated output package lead forming the output terminal 105, and the input impedance matching circuit 112 coupled between the amplifier stage 121 and its associated input package lead forming the input terminal 103.

A variety of types of Doherty amplifiers are known including, for example, symmetrical and asymmetrical Doherty amplifiers, and multi-path Doherty amplifiers that have more than one peaking amplifier path. In the present example embodiment of FIGS. 1 and 2, each of the amplifier stages 120 and 120 includes a single-stage or multi-stage power transistor implemented on a semiconductor dice. For example, but not by way of limitation, the power transistors may be field effect transistors (FETs, such as a laterally diffused metal oxide semiconductor (LDMOS) FET, a high electron mobility transistor (HEMT)), bipolar junction transistors, or other types of transistors implemented on silicon (Si), silicon on insulator (SoI), gallium nitride (GaN), gallium arsenide (GaAs), and other semiconductor substrates. In the present example embodiment of FIGS. 1 and 2, the amplifier stages 120 and 121 that are respectively implemented by the first and second dice 202 and 204, respectively, are asymmetrical because the two amplifier stages are of substantially different transistor sizes relative to one another. This is apparent from FIG. 2, which shows the amplifier stage 121 as being substantially larger in size (e.g., in periphery, as seen from the top plan view) than the amplifier stage 120. Nevertheless, as discussed above, in the present embodiment the amplifier stages 120 and 121 can be considered matched or similar, and likewise the dice 202 and 204 respectively providing those amplifier stages 120 and 121, respectively, can be considered matched or similar. For even though the amplifier stages are asymmetrical (including transistors of substantially different sizes, although the dice themselves may be of the same or different physical sizes), the dice 202 and 204 providing those amplifier stages share in common various physical and/or chemical properties that cause the circuitry provided by each of the dice, and particularly the amplifier stages 120 and 121, to operate in a substantially similar (if not identical) manner, as will be discussed in further detail below.

In addition to showing the amplifier stages 120 and 121 that are asymmetrical (even though matched or similar), FIG. 2 also shows that the amplifier stages 120 and 121 of the RF amplifier device 150 are physically aligned in terms of their respective orientations. That is, the physical direction of electrical signal flow (and the wires or leads by which such signals are communicated) extends from the bottom of the integrated circuit 200 to the top of the integrated circuit as illustrated in FIG. 2, for each of the amplifier stage 120 and the amplifier stage 121. In other words, signal flow for each of the amplifier stage 120 and the amplifier stage 121 proceeds generally from the bottom, at which the input terminals 102 and 103 are positioned, upward to a level of the input impedance matching circuits 110 and 112, then further upwards to a level of the amplifier stages 120 and 121, then additionally upwards to a level of the output impedance matching circuits 130 and 132, and finally upwards to the top, at which the output terminals 104 and 105 are positioned, when viewed as shown in FIG. 2 (with it being understood that this description should not be understood to imply actual vertical arrangements of the integrated circuit 200). Such alignment of the amplifier stage 120 and 121, and possibly the other components of the RF amplifier device 150, can be appropriate for facilitating interconnection among various electrical components on the integrated circuit, or facilitating interconnection among components on the integrated circuit 200 with components that exist external to the integrated circuit. Further, as the impedance matching circuits 110 and 112 each may include one or more integrated passive devices (IPDs) implemented as semiconductor die, the various method embodiments described herein also may be used to pick and place such IPDs from a singulated semiconductor wafer from which they form constituent parts.

Figure 3:
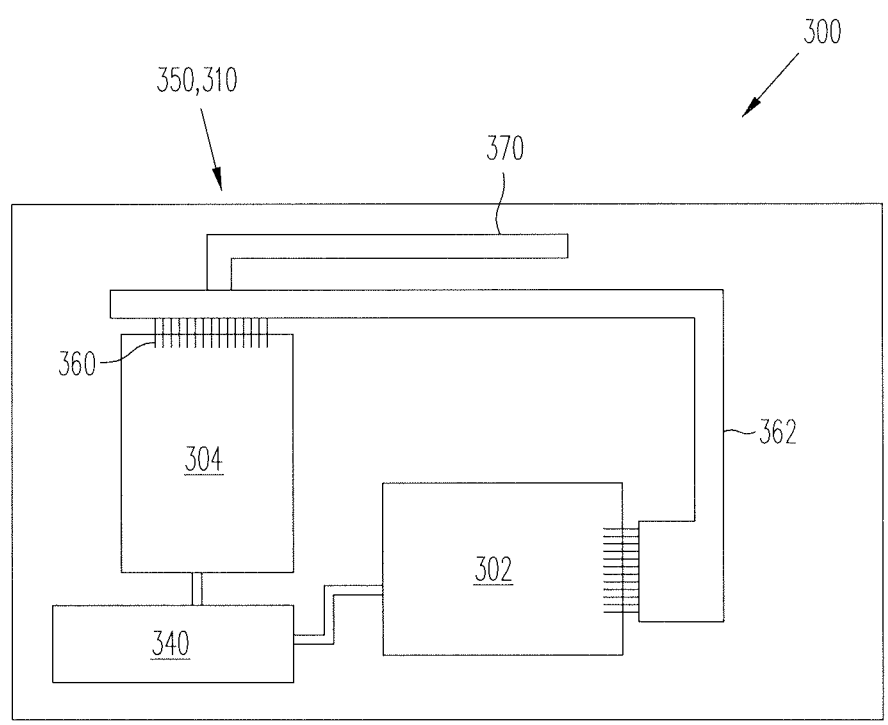
FIG. 3 is a top view of an integrated circuit (or a layout diagram) showing portions of an alternate embodiment of an amplifier system differing in certain respects from that of FIGS. 1 and 2, particularly a RF amplifier device thereof.

Notwithstanding the features of the amplifier system 100, integrated circuit 200, and RF power device 150 that are described above with respect to FIGS. 1 and 2, the present disclosure is intended to encompass methods and systems for achieving numerous other types of semiconductor-based circuits or systems with multiple components that are matched or similar. For example, FIG. 3 provides a top view of an additional integrated circuit 300 (or a layout diagram) showing an alternative amplifier system 310 that also constitutes a Doherty amplifier. In FIG. 3 (in contrast to FIG. 2), the integrated circuit 300 is shown to include an entire RF power module 350. More particularly, the RF power module 350 includes a first die 302 that constitutes a main or carrier die and a second die 304 that constitutes a peaking die. The first die 302 can provide first components such as a first or main amplifier stage, and the second die 304 can provide second components such as a second or peaking amplifier stage. The first die 302 and second die 304 can be provided on a PCB-type substrate. Additionally, the RF power module 350 also includes a power divider (or splitter) 340, which includes or employs a "lumped element inverter," and a power combiner 360 that is formed on the second die 304. Further, the RF power module 350 also includes an inverter 362, which is implemented as a printed transmission line between the outputs of the first die 302 and second die 304 (and which can in other implementations be replaced by a "lumped element inverter," as is present in the power divider 340). Additionally, an output trace 370 is provided that is coupled to the inverter 360 and (at least indirectly) coupled to the output terminals of each of the amplifier stages of the first die 302 and second die 304.

The additional integrated circuit 300 with the alternative amplifier system 310 is similar to the integrated circuit 200 with the amplifier system 100 not only in that both circuits provide Doherty amplifiers but also in that both circuits implement matched or similar components through the use of matched or similar dice. That is, just as the integrated circuit 200 employed the first die 202 and second die 204 to provide the amplifier stages 120 and 121 that are matched or similar, the integrated circuit 300 employs the first die 302 and the second die 304 to provide RF amplifier devices with amplifier stages that are matched or similar. Further, in the embodiment of FIG. 3, the amplifier stages provided by the first die 302 and second die 304 can be matched or similar in the same manner(s) as the amplifier stages 120 and 121 of FIG. 2 are matched or similar. Further, the amplifier stages provided by the first die 302 and second die 304 of FIG. 3 are even more highly matched in one respect by comparison with the amplifier stages 120, 121 of FIG. 2 in that the amplifier stages provided by the first die 302 and second die 304 are the same size, i.e., are symmetric.

However, in contrast to the embodiment of FIG. 2, the first die 302 and second die 304 are not aligned as was the case with the first die 202 and second die 204 of FIG. 2. Rather, the first die 302 and second die 304 are oriented at ninety (90) degree angles relative to one another. Such an arrangement can be advantageous to facilitate desired interconnections between components or to reduce or avoid electromagnetic cross-talk between the components of the first die 302 and the second die 304. Thus, it should be appreciated that the present disclosure is intended to encompass methods and systems for achieving semiconductor-based circuits or systems having multiple components with one or more matched or similar characteristics or features, including both such circuits or systems in which such multiple components are physically aligned with one another as well as such circuits or systems in which such multiple components are out of physical alignment by ninety (90) degrees or other amounts.

Additionally, although each of FIGS. 1, 2, and 3 relate to amplifier systems (and particularly Doherty amplifiers) having two amplifier paths and two amplifier stages respectively associated with those paths that are matched or similar, the present disclosure is also intended to encompass other embodiments. In particular, the present disclosure is intended to encompass embodiments allowing for the development of circuits or systems in which there are more than two amplifier paths and accordingly more than two amplifier stages that are matched or similar (for example, as can be formed via more than two peaking amplifier dice). Also, although single-stage amplifier paths such as the amplifier paths 122 and 123 are described above, the present disclosure is intended to encompass embodiments allowing for the development of circuits or systems having multi-stage amplifier paths. Also, the present disclosure is intended to encompass methods and systems that allow for the development of amplifier circuits in which a pre-amp power amplifier (PA) transistor is followed by a final stage PA transistor (or a driver PA+final stage PA arrangement) or indeed for any other multi die configuration, push-pull configuration, Darlington pair configuration, current mirror configuration, etc.

Indeed, the present disclosure is intended to allow for the development of circuits or systems having multiple matched or similar components provided by way of multiple die bond applications regardless of the technology (e.g., analog, digital, radio-frequency, or other technologies). That is, notwithstanding the above discussion concerning amplifier systems and circuits, the present disclosure is intended also to encompass embodiments of methods and systems for achieving circuits or systems having multiple matched or similar components (e.g., by implementing multiple matched or similar dice) that are other than amplifier systems and circuits.

Figure 4:
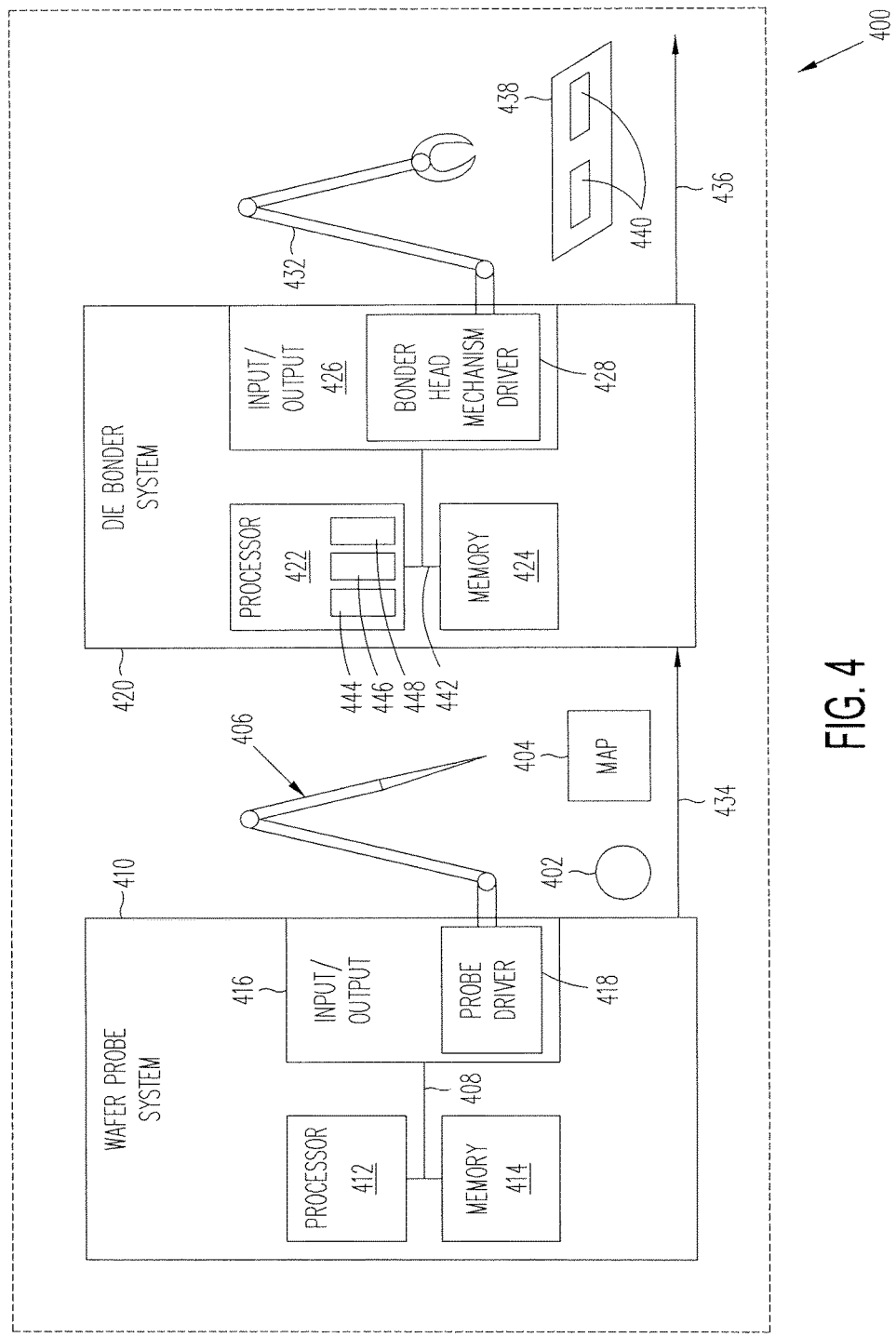
FIG. 4 is a block diagram illustrating components or features of an example pick and place machine or system that can be utilized to implement multiple matched (or similar) dice into a circuit or system such as any of those of FIGS. 1, 2, and 3, so as to provide multiple matched (or similar) components into such a circuit or system, in accordance with one or more of the methods described herein.

Referring now to FIG. 4, a block diagram is provided to show an example system 400 that can be employed to achieve semiconductor circuits or systems having components that are matched or similar in terms of one or more characteristics or features, in accordance with one or more of the methods encompassed herein. In the present example embodiment, the system 400 particularly includes a wafer probe system 410 and a die bonder system 420 that are in communication with one another. Although the system 400 is shown to include the die bonder system 420, it should be appreciated that the die bonder system 420 is intended to be representative of any of a variety of different types of assembly machines, particularly assembly machines that can be operated to implement one or more dice, including for example a pick and place machine, a die sorting machine, etc. Further for example, it should be appreciated that a die sorting machine can operate to pick up dice from a wafer and put those dice onto temporary carrier(s) (e.g., any of carrier tape, waffle pack, jedec tray, or film frame structures) and subsequently, at a later time operate further to pick up the dice from the temporary carrier(s) and assemble those dice in relation to or into the final semiconductor device, circuit, or system. Accordingly, it should be appreciated that the operation of the die bonder system 420 described herein, in terms of its operation to implement dice, is intended to be representative of the operation of any of a variety of assembly machines such as any of those mentioned above that operate to position dice onto any of a variety of types of substrates or target circuit or system structures including target structures that are temporary in nature including, for example, a flange, a PCB, or a temporary carrier such as any of those mentioned above.

The wafer probe system 410, as will be described in further detail below, operates to probe silicon wafers such as a wafer 402 to develop wafer maps (e.g., electronic wafer maps or wafer map data files, which can also be displayed or printed out as hardcopy maps documents) such as a wafer map 404 of the dice on the wafer. To achieve these objectives, the wafer probe system 410 can employ, for example, electrical probing technology, or electro glass technology, or ASM technology.

In the present example embodiment, the wafer probe system 410 particularly includes a processor 412, a memory 414, and one or more input/output devices 416. The input/output devices 416 particularly include a probe driver 418 that serves to provide electrical power signals (e.g., to control one or more electromechanical or motor actuators) to move and operate an electronic probe 406 to different locations including different locations on the wafer 402 in response to control signals provided to the probe driver 418 from the processor 412. As shown, all of the processor 412, memory 414, and input/output devices 416 can be in communication with one another by way of one or more internal communication links, such as a bus 408.

Further as shown in FIG. 4, the wafer probe system 410 interacts with the die bonder system 420 by providing each wafer such as the wafer 402 and each wafer map such as the map 404 to the die bonder system after each wafer has been probed so as to generate a corresponding map. The movement of the wafer 402 and the map 404 from the wafer probe system 410 to the die bonder system 420 is represented by an arrow 434. Also as represented by the arrow 434, it should be appreciated that wafer maps such as the wafer map can be communicated electronically between the wafer probe system 410 and the die bonder system 420 by way of one or more electronic communication links such as, for example, a wired or dedicated communication link, a wireless communication link, an internet-type communications link, or combinations of any of these types of communication links and/or other communication links. The die bonder system 420, upon receiving a wafer such as the wafer 402 and an associated wafer map such as the wafer map 404 operates in accordance with an assembly control program, based at least in part upon the information contained in the wafer map, to fabricate or otherwise achieve one or more circuits or systems. More particularly, the die bonder system 420 in accordance with the assembly control program fabricates or otherwise achieves one or more circuits or systems that each include two or more of the mapped dice found on the wafer received by the die bonder system.

As shown, the die bonder system 420 includes a processor 422, a memory 424, and one or more input/output devices 426, which include in the present example embodiment, a pick and place head mechanism driver 428. The processor 422, memory 424, and input/output devices 426 can be coupled by one or more internal communication links such as a bus 430. The pick and place head mechanism driver 428 serves to provide electrical power signals (e.g., to control one or more electromechanical or motor actuators) to move and operate a pick and place head mechanism 432, in response to control signals provided to the pick and place head mechanism driver 428 from the processor 422. In the present embodiment, the pick and place head mechanism operates to grasp or pick up dice from wafers such as the wafer 402 and to move those dice to other positions at, and to place them onto, a receiving circuit or system structure such as a substrate 438. For example, the substrate 438 may be a substrate associated with a final product, such as a flange or PCB of a packaged electronic component or a circuit. Further, in the present example embodiment, the die bonder system 420 serves to cause each die that is positioned on a receiving circuit or system structure such as the substrate 438 to be bonded or attached to that target circuit or system structure. Such bonding operation is not typically performed by the pick and place head mechanism 432, but rather is performed by other mechanism(s) that operate in coordination with the pick and place head mechanism. For example, die bonding can involve another process, such as heating the substrate/die to form a bond between the die and the substrate. To that end, some sort of adhesive material, solder, or sinterable material is positioned between the die and the substrate prior to the "bonding" operation. The material can be applied to the bottom of the die, to the top of the substrate, or both.

Thus as, represented by an arrow 436, the die bonder system 420 operates to output circuits or systems, or structures underlying or supporting such circuits or systems such as the substrate 438, on which multiple dice such as dice 440 have been implemented. Alternatively, the substrate 438 may be a temporary carrier, such as a carrier tape, a waffle pack, a JEDEC tray (matrix tray), a film frame, or another temporary carrier. In embodiments in which the pick and place head mechanism 432 places the die onto a substrate 438 that functions as a temporary carrier, the "die bonder system" instead is considered a die sorting machine that does not actually "bond" the die to the substrate 438. Instead, the matched die on the temporary carrier later may be removed from the temporary carrier and implemented into a final product. Accordingly, use of the term "die bonder system" is not intended to limit implementation of the embodiments only to systems that perform a die bonding operation.

It should be appreciated that the processors 412 and 422 shown in FIG. 4 are intended to be representative of any of a variety of different types of processing devices including, for example, microprocessors, programmable logic devices (PLDs) and other computer devices. Further, although only the processor 412 and processor 422 are illustrated, in some embodiments more than one such processor or processing device can be present in one or both of the wafer probe system 410 and the die bonder system 420. Additionally, each of the memory 414 and the memory 424 is intended to be representative of any of a variety of different types of memory devices including, for example, read-only memory (ROM) devices, random access memory (RAM) devices, programmable read-only memory (PROM) memory devices, electrically erasable programmable read-only memory devices (EEPROM), and other memory devices. Although only the memory device 414 and memory device 424 are shown in FIG. 4, it should be appreciated that in other embodiments more than one memory device can be present on one or both of the wafer probe system 410 and die bonder system 420.

In the present embodiment, the wafer probe system 410 and the die bonder system 420 are separate, distinct machines that are at least intermittently if not continuously in communication with one another by way of any of a variety of communication links as represented by the arrow 434. Nevertheless, in alternate embodiments, it is possible that the wafer probe system 410 and the die bonder system 420 can be implemented together, in combination with one another, as a combination wafer probe and die bonder system. Further, it should be appreciated that, although FIG. 4 shows the die bonder system 420, the present disclosure is intended to encompass embodiments that employ systems other than die bonder systems such, as for example, pick and place systems, die sorting machines, or systems in which multiple distinct machines take the place of the die bonder system 420. Also, the present disclosure is intended to encompass embodiments in which multiple distinct machines take the place of the wafer probe system 410, or in which there are machines that take the place of portions or components of the wafer probe system 410 and/or the die bonder system 420.

Additionally, although each of the wafer probe system 410 and die bonder system 420 in the present embodiment is shown to have its own dedicated processing and memory devices in FIG. 4, in some other embodiments, such processing and memory devices can be distributed, shared, or remotely provided. For example, in some embodiments, both of the wafer probe system 410 and the die bonder system 420 can share the same processor(s) and/or the same memory device(s). Also for example, in some embodiments, the memory for one or both of the wafer probe system 410 and the die bonder system 420 can be provided by way of cloud storage. In the present embodiment, it is envisioned that each of the wafer maps such as the wafer map 404 can also be stored in the memory 414 of the wafer probe system 410 upon the wafer probe system generating such maps, and also can be stored within the memory 424 of the die bonder system 420 after the maps are communicated between the wafer probe system and the die bonder system 420. Alternatively, however, such wafer maps can be stored remotely such as in cloud storage.

As will be described in further detail below, in the present embodiment, the wafer probe system 410 and particularly the processor 412 thereof operates at least partly in accordance with a wafer map program or programming, instructions for which can be stored on the memory 414 of the wafer probe system 410. Given this to be the case, the processor 412 shown in FIG. 4 can be viewed as including (or constituting) a module or circuitry that is configured to operate in accordance with such a wafer map program, or that is configured to control operations of the probe 406 that allow for determinations of the status of various dice on the wafer 402 to be assessed and to be stored on a wafer map such as the wafer map 404. Also, the die bonder system 420 and particularly the processor 422 thereof operates at least partly in accordance with an assembly program or programming, instructions for which can be stored in the memory 424 of the die bonder system 420. Given this to be the case, the processor 422 of the die bonder system 420 shown in FIG. 4 can be viewed as including (or constituting) one or more modules or circuitry that is configured to operate in accordance with such an assembly program, or that is configured to control operations of the pick and place head mechanism 432 that allow for the picking and placement of dice from a wafer such as the wafer 402 (or die sorting), as well as allow for the attachment or bonding of such dice to a target structure such as the substrate 438.

In the present embodiment, the assembly program can be understood as encompassing at least three different aspects, such that the processor 422 particularly can be understood as including three different modules (or submodules) or three different types of circuitry, which are respectively illustrated in FIG. 4 by a first module 444, a second module 446, and a third module 448. In accordance with a first aspect of the assembly program, the first module 444 of the processor 422 operates to determine the generation of control signals that at least indirectly govern movement of the pick and place head mechanism 432, as well as related operations involving attempts to pick up and place (die sort), and to bond to a target structure such as the substrate 438, one or more dice. In accordance with a second aspect of the assembly program, the second module 446 of the processor 422 operates to assess whether attempts to implement one or more of the dice in relation to a target structure (e.g., the substrate 438) should be skipped based upon wafer map information concerning whether the dice are suitable for being implemented.

Additionally, in accordance with a third aspect of the assembly program, the third module 448 of the processor 422 operates to assess, at least indirectly based upon sensed input signals returned from the pick and place head mechanism 432 or other information, whether dice were not implemented on a target structure (e.g., the substrate 438) in accordance with one or more of the control signals. Further, the third module 448 of the processor 422 additionally operates to determine whether a position of one die on the wafer is sufficiently proximate to the position on the wafer from which another die was already obtained, such that it would be appropriate to implement the one die on the target structure (e.g., the substrate 438) subsequent to the other die being implemented on that structure so as to achieve a circuit or system having matched or similar components. As will be appreciated from additional discussion below, the operation of the first module 444 to determine the generation of control signals can be based upon the determinations and assessments made by the second module 446 and the third module 448.

As discussed above, the present disclosure is intended to encompass not only the system 400 and the wafer probe and die bonder systems 410, 420 thereof, but also a variety of alternative embodiments of such systems. For purposes of example, however, with reference additionally to FIG. 5, a front perspective view of an example die bonder machine 500 is provided to illustrate one possible die bonder machine having features (e.g., in terms of the pick and place head mechanism 432 and pick and place head mechanism driver 428) that can be utilized to achieve, or that can be modified to arrive at, the die bonder system 420 of FIG. 4. In the present embodiment, the machine 500 is a modified version of a DB 2100 sD$^{plus}$ die bonder system or alternatively a DB sD PPP$^{plus}$ die bonder system, as are available from BE Semiconductor Industries N.V. of Duiven, The Netherlands, with particular modifications including (for example) inclusion of the memory 424 and the processor 422, including the modules 444, 446, and 448 of FIG. 4. That is, although not visible in FIG. 5 (and not part of conventional DB 2100 sD$^{plus}$ or DB sD PPP$^{plus}$ die bonder systems), it should be appreciated that the machine 500 includes one or more processing and one or more memory devices corresponding to the processor 422 and the memory 424 of the die bonder system 420 and is programmed to operate in accordance with an assembly program as described herein.

Figure 5:
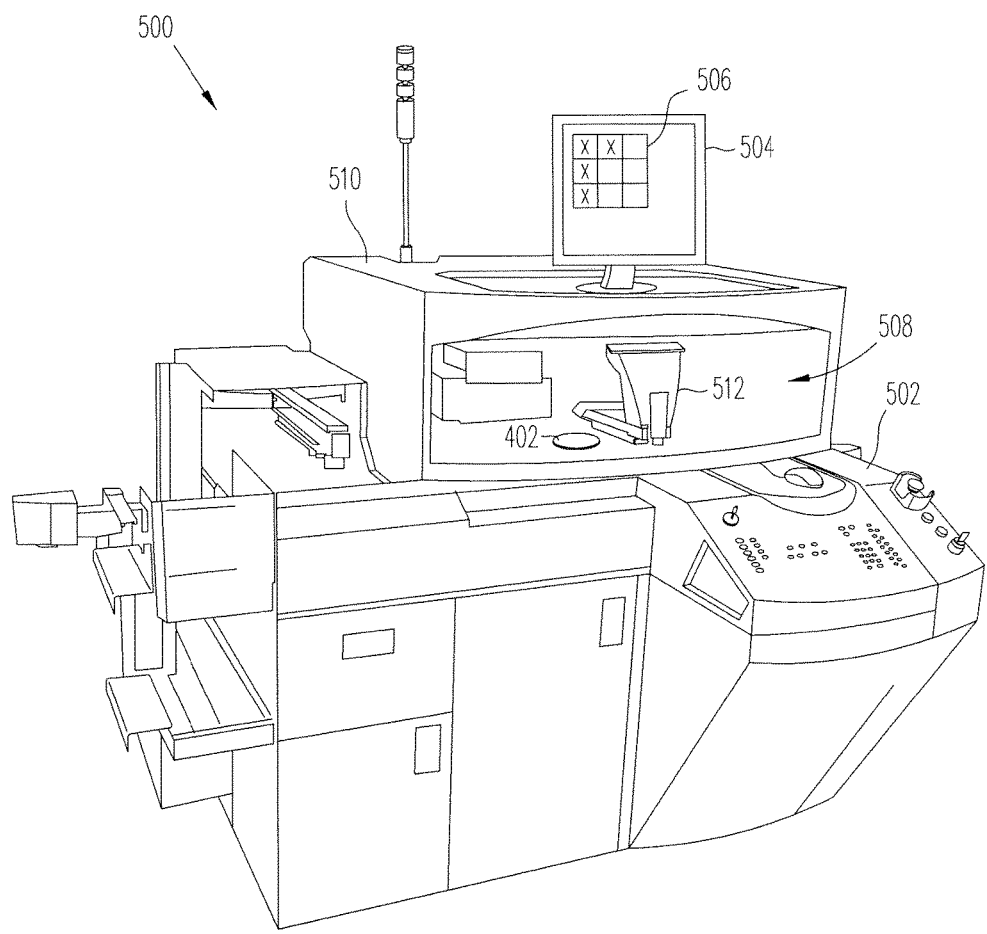
FIG. 5 is an additional schematic diagram illustrating additional components or features of the example pick and place machine or system of FIG. 4.

In the example embodiment of FIG. 5, the machine 500 particularly includes an operator input dashboard 502 by which an operator can interact with and provide instructions to the machine 500, as well as an output monitor or display 504 that allows for an operator to monitor operation of the machine. Each of the input interface 502 and the display 504 can be considered as being encompassed by the input/output devices 426 of the die bonder system 420 of FIG. 4. In FIG. 5, the display 504 particularly is showing an array 506 indicative of how different dice have or have not yet been placed on and bonded to a substrate. Also shown in FIG. 5 is a cavity region 508 proximate a top 510 of the machine 500. Within the cavity 508 is visible a die bonding head 512 that can be understood as corresponding to (or to a portion of) the pick and place head mechanism 432 of FIG. 4. It should be appreciated that the die bonding head 512 can move within the cavity 508. For illustration purposes, the wafer 402 is shown also to be positioned within the cavity 508. It should be appreciated that the die bonding head 512 can pick up dice from the wafer 402, then transport and place such dice onto a substrate or other target structure such as the substrate 438 of FIG. 4 (not shown in FIG. 5), and then bond such dice to such a structure to arrive at an assembled circuit or system.

Also, in the present embodiment, it should be appreciated that the die bonding head 512 is capable of a variety of translational and rotational movements so that different dice can be positioned on a substrate in different orientations. For example, the die bonding head 512 can perform translational or rotational movements as appropriate to allow for the formation of either of the circuits or systems described in relation of FIGS. 2 and 3 in which the paired dice are either aligned with one another or arranged ninety degrees out of alignment. The machine 500, and the die bonding head 512 thereof, often are operated such that individual dice of a group of matched or otherwise similar dice are each individually picked up, placed, and bonded in separate movements. Nevertheless, particularly in instances in which a pair or group of matched or similar dice are to be placed onto a substrate or other target structure in an arrangement that corresponds directly to the arrangement in which the dice are originally positioned on the wafer 402 (e.g., in alignment), it is possible for the die bonding head 512 to pick up, place, and bond those multiple dice together as a set all in one trip.

Although the machine 500 is intended to represent a die bonder machine that can serve as the die bonder system 420 of FIG. 4, it should be appreciated that in some alternate embodiments the machine 500 (or a modified version of it) can also perform wafer probing operations and thus serve as a wafer probe system corresponding to the wafer probe system 410 of FIG. 4. That is, the machine 500, or a modified version of it, can also be considered to constitute the system 400 of FIG. 4.

Figure 6:
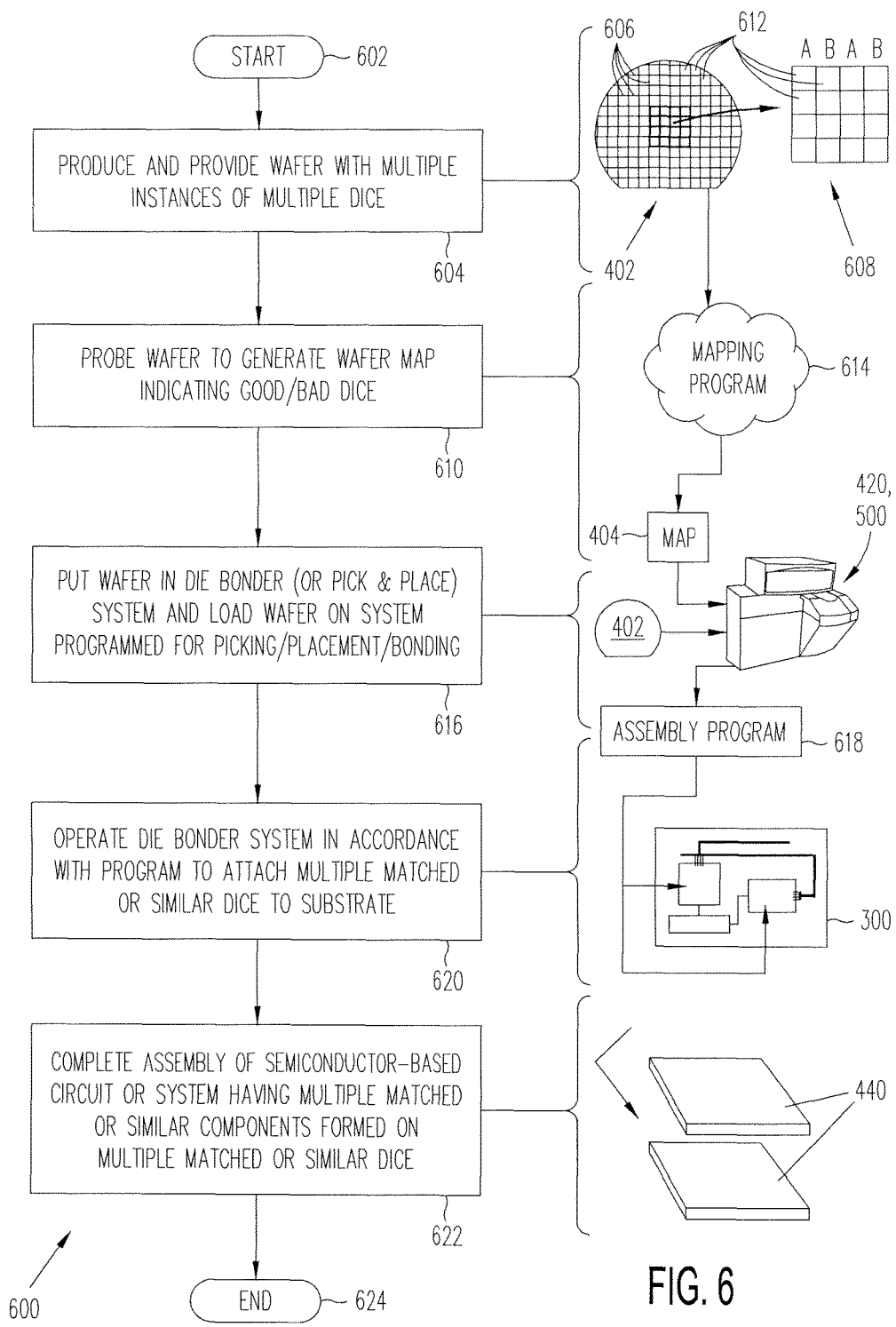
FIG. 6 is a flow chart illustrating steps of an example method for implementing multiple matched (or similar) dice into a circuit or system so as to provide multiple matched (or similar) components into such a circuit or system, in accordance with one embodiment encompassed herein.

Turning to FIG. 6, a flow chart 600 is provided to illustrate steps of an example method or process for implementing multiple matched or similar dice into a target circuit or system so as to provide multiple matched or similar components into such a circuit or system. As illustrated, the flow chart 600, upon commencing at a start step 602, begins at a step 604 at which a wafer with multiple instances of multiple dice is produced and provided to a wafer probe system such as the wafer probe system 410 of FIG. 4. FIG. 6 particularly shows the wafer 402 as being singulated, with numerous dice 612 that are separated from one another by lines of a grid 606. Additionally, an exploded portion 608 of the wafer 402 is also shown, to illustrate aspects of the wafer 402 in one example embodiment.

As particularly shown by the exploded portion 608, in a circumstance in which it is desired to form circuits or systems having pairs of components that are matched or similar by providing pairs of dice that are matched or similar, the grid 606 of the wafer delineates alternating columns (marked A and B), where each A column is followed by a B column and each B column is followed by an A column. With such an arrangement, the dice 612 are of two types or bins, with the dice of a first type being within the A columns and the dice of a second type being with the B columns. Notwithstanding this example shown in FIG. 6, in another circumstance in which it is desired to achieve circuits or systems in which there are more than two (e.g., three, four, or more) matched or similar components by providing more than two matched or similar dice, then the grid lines of the wafer can establish sets of columns having more than two columns per set. For example, in a circumstance in which it is desired to achieve circuits or systems in which there are three matched or similar components, the wafer can be singulated so as to have an A column, followed by a B column, followed by a C column, followed repeatedly again by another A column, another B column, and another C column.

Following the step 604, at a step 610 the wafer probe system 410 probes the wafer and, based upon a mapping program 614, generates a wafer map such as the wafer map 404 indicating which of the dice 612 are suitable for implementation into a target circuit or system ("good dice") and which of the dice 610 are not suitable for implementation into a target circuit or system ("bad dice"). Upon completion of the step 610, then at a step 616 the wafer 402 is provided to the die bonder system 420 from the wafer probe system 410 and the wafer map 404 is loaded onto the die bonder system 420, which in the present embodiment also is the die bonder machine 500 (although as already discussed, the die bonder system can also be another type of die bonder system or another system such as a pick and place system, a die sorting machine, and so on). As illustrated, the processor 422 of the die bonder system 420 operates in accordance with an assembly program 618, such that the processor 422 includes the modules (or circuitry) 444, 446, and 448 discussed above. Accordingly, the processor 422 is programmed for picking, placement, and bonding of dice such as the dice 612 onto a system or circuit structure suitable for receiving the dice, such as the substrate 438. The assembly program 618 is described in more detail below.

Next, at a step 620, the die bonder system 420 operates in accordance with the assembly program 618 to pick, place, and bond multiple matched or similar ones of the dice 612 to the substrate 438 (or other target structure) so as to arrive at an assembled circuit or system having multiple matched or similar components. The circuit or system with matched or similar components can be, for example, the integrated circuit 300 having the RF power module 350 shown with respect to FIG. 3 as illustrated, or alternatively can take any variety of other forms (for example, the integrated circuit 200 with the RF amplifier device 150 of FIG. 2).

Finally, upon completion of the step 620, then at a step 630 the entire semiconductor-based circuit or system having multiple matched or similar components formed by way of the multiple matched or similar dice is completed, as to arrive at finished circuits or systems. The circuits or systems that result from the step 622 can be the same as, or only minimally different from, the circuits or systems that are achieved upon the completion of the step 620. This can be the case, for example, if the completing of the assembly process at the step 622 only involves moving/transporting the structures that are the result of the step 620, or minor processing steps in relation thereto. Alternatively, the circuits or systems that result from the step 622 can be considerably different from, or more complex than, those which result from the step 620. In the present example, a combination structure including the two dice 440 is illustrated as constituting a "completed" circuit or system, albeit it should be appreciated that a completed circuit can typically take a variety of forms and would not typically be limited to a pair of dice. Upon completion of the steps 622, the method represented by the flow chart 600 ends at an end step 624, although it should be appreciated that the entire method can be repeated over and over again.

Referring now to FIG. 7, an additional flow chart 700 illustrates steps of an example method or process that is employed as a part of the method or process shown in FIG. 6 (for example, as a subprocess encompassed by the process represented by FIG. 6) to develop a wafer map such as the map 404. As already mentioned, the map 404 identifies dice that are suitable for implementation (good dice), or are not be suitable for implementation (bad dice), into a circuit or system in accordance with the method of FIG. 6. The method represented by the flow chart 700 can particularly be considered to be performed as, or as part of, the step 610 of FIG. 6, according to which a wafer such as the wafer 402 is probed to generate the wafer map indicating the good/bad dice. Further, the method represented by the flow chart 700 can be performed by the wafer probe system 410, and particularly by the processor 412 thereof, in accordance with instructions stored in the memory 414 of the wafer probe system.

Figure 8B:
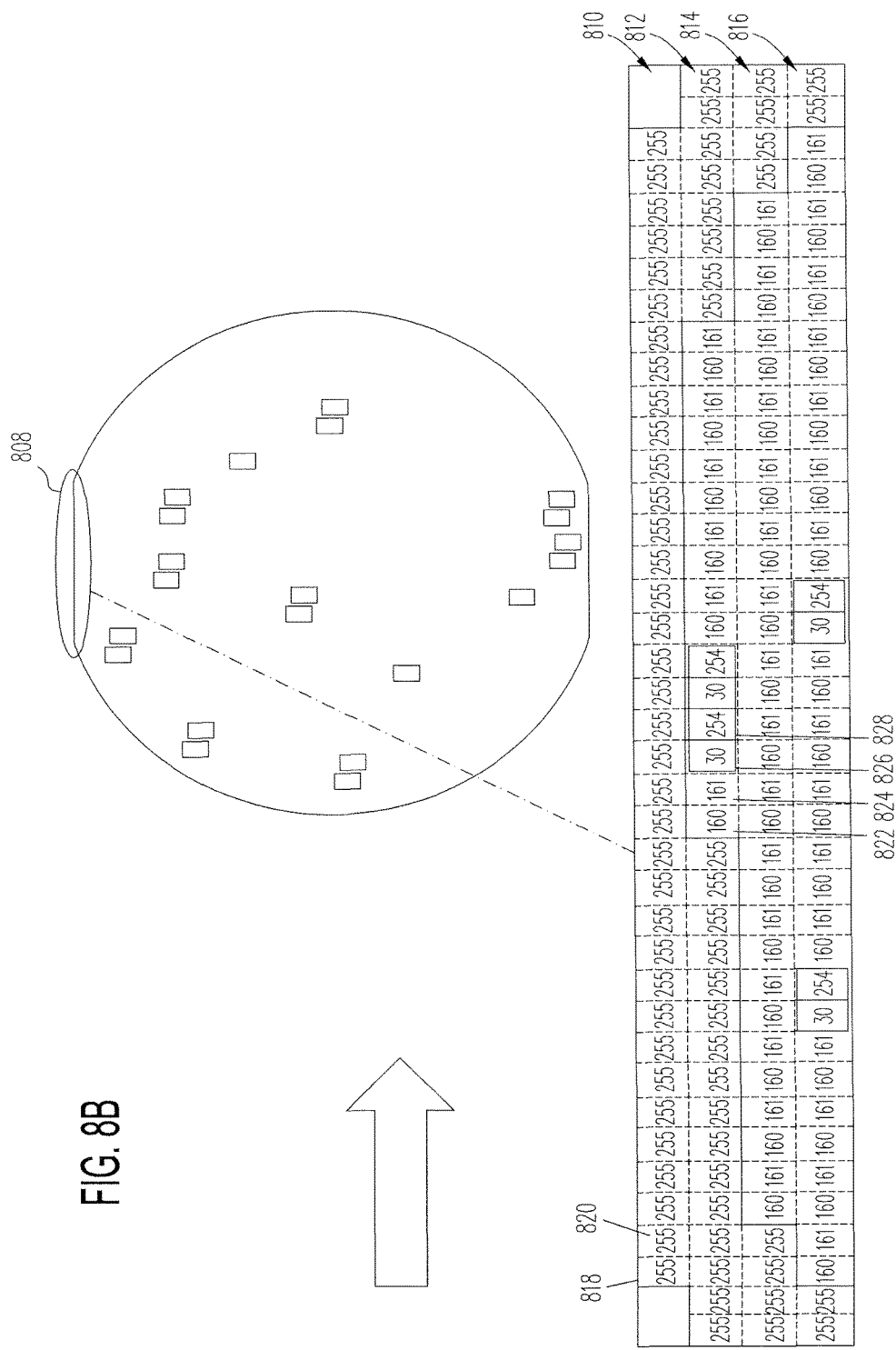
FIG. 8, which includes each of FIG. 8A and FIG. 8B as subparts thereof, illustrates figuratively a wafer with multiple dice formed thereon (FIG. 8A) as well as an example map of the dice that can be developed in accordance with the method of FIG. 7 (FIG. 8B)

To enhance the appreciation of the flow chart 700, FIG. 7 can be viewed in relation to FIG. 8. FIG. 8, which includes FIG. 8A and FIG. 8B as subparts thereof, illustrates how a wafer such as the wafer 402 can have multiple dice such as the dice 612 thereon, and how a wafer map such as the map 404 can be developed in accordance with the method of FIG. 7. More particularly, as represented by FIG. 8A (and consistent with the description already provided with respect to FIG. 6), a wafer such as the wafer 402 can be singulated such that a grid such as the grid 606 (which can also be referred to as a reticle) divides up the territory of the wafer into multiple dice such as the dice 612. For clarity, in addition to showing the wafer 402 as a whole, FIG. 8A also shows an exploded portion 802 of the wafer that (as was the case with the exploded portion 608 of FIG. 6) illustrates a group of the dice 612 that are situated on the wafer 402. More particularly, the exploded portion 802 shows an array of the dice 612 that particularly comprises six and a half columns of the dice by seven rows of the dice.

Consistent with the above description provided in relation to FIG. 6, in the present example embodiment, the array of the dice 612 of the exploded portion 802 includes two types of dice, namely, dice of an A-type and dice of a B-type. The A-type dice are arranged in A columns 804 on the wafer 402, the B-type dice are arranged in B columns 806 of the wafer, and the A-type columns are alternated with the B-type columns as shown. With such an arrangement of two types of the dice 612, it is intended that the dice of the wafer 402 are to be implemented on circuits or systems that require pairs of matched or similar dice. By comparison, in a circumstance in which it was desired for circuits or systems to be achieved that had groups of three (or possibly more) matched or similar dice, then implementation would involve a wafer providing three (or more) different types of dice arranged respectively in three (or possibly more) sets of alternating columns (or alternatively rows) of the wafer. It should be appreciated that, in the embodiment of FIG. 8A, the dice of the different types (in this example, the A-type dice and B-type dice) are different types of dice. That is, the A-type dice are different in one or more respects from the B-type dice, even though the A-type dice and B-type dice also are matched or similar in one or more respects.

Referring again to FIG. 7, given such an arrangement of dice on the wafer 402 as shown in FIG. 8A, the method of flow chart 700 develops a wafer map by probing sequentially the dice of each column in a given row, successively, for each additional row within the wafer, successively. In the present example, the probe proceeds from left to right across the dice of each row and, upon reaching the end of the row, moves to the next adjacent row (below the current row, when viewing the wafer as shown in FIG. 8A), and thus the probing process follows a Z (or repeated-Z) type route about the wafer 402. In alternate embodiments, however, other routes can be followed including, for example, routes in which the probe proceeds from right to left across the dice of each row, and routes in which the probe proceeds from top to bottom (or bottom to top) across the dice of each column and then proceeds to the next column.

More particularly as shown, upon commencement of the method at a start step 702, the processor 412 of the wafer probe system 410 causes or directs the electronic probe 406 to proceed to a first row of the wafer (e.g., the wafer 402). By the first row of the wafer, this particularly is intended to refer to the first row of the wafer in which there are dice that are candidates for being A-type or B-type dice. Typically, this first row of the wafer would be a row along or near a top edge of the wafer. Next, at a step 704, the processor 412 additionally causes the probe 406 to proceed to a first column of the first row. In the present embodiment, the first column is the leftmost column existing in the row at which a die existed, although in other embodiments the first column can be the rightmost column or another column of the row. Subsequently, at a step 706, the processor 412 causes the probe 406 probes the die existing at the presently-identified column, which can be referred to as the column C, of the presently-identified row, which can be identified as the row R. The operation of the probe 406 particularly allows the wafer probe system 410 to get or obtain characteristic information about each of a die C (that is, the die within the row R at the column C) as well as an adjacent die C+1 of the row R (that is, the die at the neighboring column within the same row, that is, the die immediately to the right of the die C in the row R).

Next, at a step 708, the processor 412 of the wafer probe system 410 determines, based upon the sensed information communicated back from the probe 406, whether either of the dice at the column C or the column C+1 within the row R are suitable for implementation (whether either of the dice is a good die). If it is determined at the step 708 that one or both of the dice at the columns C or C+1 of the row R is a good die, then the process advances to a step 710, at which the processor 412 of the wafer probe system 410 further determines whether the die at the column C of the row R particularly is a good die. If this is determined to be the case, then at a step 712 the processor 412 of the wafer probe system 410 assigns or changes a bin assignment of the die at the column C of the row R to be within a bin A, and the die (which is positioned in an A column) is considered to be an A-type die suitable for implementation into a circuit or system. Assuming this occurs, the process then advances to a step 714 at which the processor 412 of the wafer probe system 410 determines whether the die at the C+1 column of the row R also is a good die. If this is in fact the case, then at a step 716 the processor 412 assigns or changes a bin assignment to the die at the column C+1 of the row R to be within a bin B, and die (which is positioned in a B column) is considered to be a B-type die suitable for implementation into a circuit or system. Upon completion of the step 716, the process advances to a step 718.

However, if it is determined at the step 708 that neither of the dice at the column C or the dice at the column C+1 of row R is a good die, then both of those dice are deemed unusable and "inked" and, at this juncture the process instead advances from the step 708 to a step 718. Further, if it is determined at the step 710 that the die at the column C of the row R is not a good die, then the process advances from the step 710 to a step 720, at which the wafer probe system 410 inks the die in question, that is, the die is identified as one that cannot be implemented into a circuit or system. Then, upon completion of the step 720, the process also advances to the step 718. Further, if after the step 714 it is determined that the die at the column C+1 of the row R is not a good die, then the process advances from the step 714 to a step 722, at which the wafer probe system 410 inks the die at the column C+1 of row R so that it is identified as a dice that cannot be used. Then, upon completion of the step 722, the process also advances to the step 718.

Upon reaching the step 718 from the step 716, the dice associated with the columns C and C+1 at the presently-identified row R have been probed and identified and ascribed bin values (or numbers) indicative of the capacities in which the dice are suitable for implementation in a circuit or system (ascribed to bin A or bin B). Alternatively, upon reaching the step 718 from any of the steps 708, 720, and 722, one or both of the dice associated with the columns C and C+1 at the row R have been determined to be not suitable (and/or inked). Regardless of how the process reaches the step 718, at that step the wafer probe system 410 further determines whether there are additional columns in the presently-identified row at which there potentially are other useful dice. As indicated in FIG. 7, in the present embodiment this determination is made by the processor 412 particularly based upon a determination of whether there exists a column C+2 in the present row. If such an additional column exists in the presently-identified row of the wafer 402, then the process advances to a step 724, at which the probe 406 advances across the row by two columns (such that the new value of the column is equal to the old value of the column plus two) and then the process returns to the step 706, at which point the sequence of steps 706-722 is repeated.

However, if at the step 718 it is determined that the column C+2 does not exist (for example, because the probe 406 has reached the right edge of the wafer 402), then the process instead advances from the step 718 to a step 726. At the step 726, the processor 412 of the wafer probe system 410 further determines whether the wafer 402 has an additional row in which potential dice that are potentially suitable for use as A-type or B-type dice are available (e.g., whether the presently-identified row is at the bottom of the wafer 402 or whether there is at least one additional row below the present row within the wafer). If an additional row is available, then the process advances from the step 726 to a step 728, at which the value of the presently-identified row is incremented by one (that is, the R=R+1). Upon completion of the step 728, then the process returns to the step 706 and the sequence of steps 706-726 is repeated. However, if at the step 726 it is determined that the wafer does not have any additional row, then the process instead ends at an end step 730.

Referring again to FIG. 8, and particularly FIG. 8B thereof, example results of the method of FIG. 7 in establishing a wafer map such as the wafer map 404 are also figuratively illustrated. As shown, an exploded upper region 808 of the wafer 402 (that is the upper region 808 shown in FIG. 8B is intended to be a representative of a corresponding region of the wafer 402 shown in FIG. 8A, notwithstanding any differences in the rounded shapes of the wafers as those are illustrated in FIGS. 8A and 8B) includes four distinct rows of singulated dice, namely, first, second, third, and fourth rows 810, 812, 814, and 816, respectively. With such rows of dice, performance of the method of FIG. 7 in regard to the wafer 402 would begin by probing the dice in the first row 810 (that is, the uppermost row), beginning with a leftmost pair of dice 818 and 820 within that row. In the present example embodiment, because those dice along the uppermost row are along a periphery or edge of the wafer 402, neither of those dice would be suitable for use as A-type or B-type dice. Consequently, each of those dice would be inked in accordance with the step 708. In the present example embodiment, each of those dice are particularly illustrated as being given a bin number 255 that is indicative of the dice being along the periphery of the wafer 402 and not being suitable for constituting either A-type or B-type dice. Subsequently, also in accordance with the method of FIG. 7, all of the dice along the first row 810 would be identified as unsuitable and ascribed this bin number, and likewise several of the dice along the second row 812 would also be identified as unsuitable and ascribed this bin number.

Additionally as illustrated in FIG. 8B, upon further operation according to the method of FIG. 7, ultimately the probe 406 would reach the pair of dice at a seventeenth column 822 and an eighteenth column 824 of the second row 812. In the present example, the probe 406 at this juncture would recognize that each of the dice at these locations is suitable for use, and more particularly that the die at the seventeenth column 822 of the second row 812 is suitable for use as an A-type die and that the die at the eighteenth column 824 of the second row 812 is suitable for use as a B-type die. Accordingly, in accordance with the method of FIG. 7, the die at the column 822 would be ascribed a bin number 160 indicating that the die is suitable as an A-type die, and the die at the column 824 would be ascribed a bin number 161 indicating that the die is suitable as a B-type die.

Further in accordance with the method of FIG. 7, after considering the dice at the columns 822 and 824, in the present example the probe 406 would advance next to an additional two columns in accordance with the step 724 and consider the dice at a nineteenth column 826 and a twentieth column 828. In this example, the probe 406 at this juncture would recognize that the die at the nineteenth column 826 of the second row 812 is unusable in accordance with the step 710 of the method of FIG. 7, and consequently would ink that die in accordance with the step 720 of that method. Accordingly, the die at the column 826 would be ascribed a bin number 30 indicating the die to be unsuitable for use as an A-type die. Also in this example, the probe 406 would determine that the die at the twentieth column 828 of the second row 812 is unusable at the step 714 of the method of FIG. 7, and consequently would ink that die in accordance with the step 722 of that method. Accordingly, the die at the column 828 would be ascribed a bin number 254 indicating the die to be unsuitable for use as a B-type die (the dice marked with bin numbers 30 and 254 are displayed with solid rectangles in FIG. 8B merely for purposes of highlighting the inked dice, and not because the dice are of different sizes). Thus, it should be appreciated that the exploded upper region 808 shown in FIG. 8B is illustrative of part of a wafer map such as the wafer map 404, with each of the dice 612 of the wafer being ascribed a bin number indicating that the die is either suitable as an A-type die, suitable as a B-type die, improper for use as an A-type die, improper for use as a B-type die, or improper for use as a die due its being situated at or proximate to the periphery of the wafer 402.

Figure 9A:
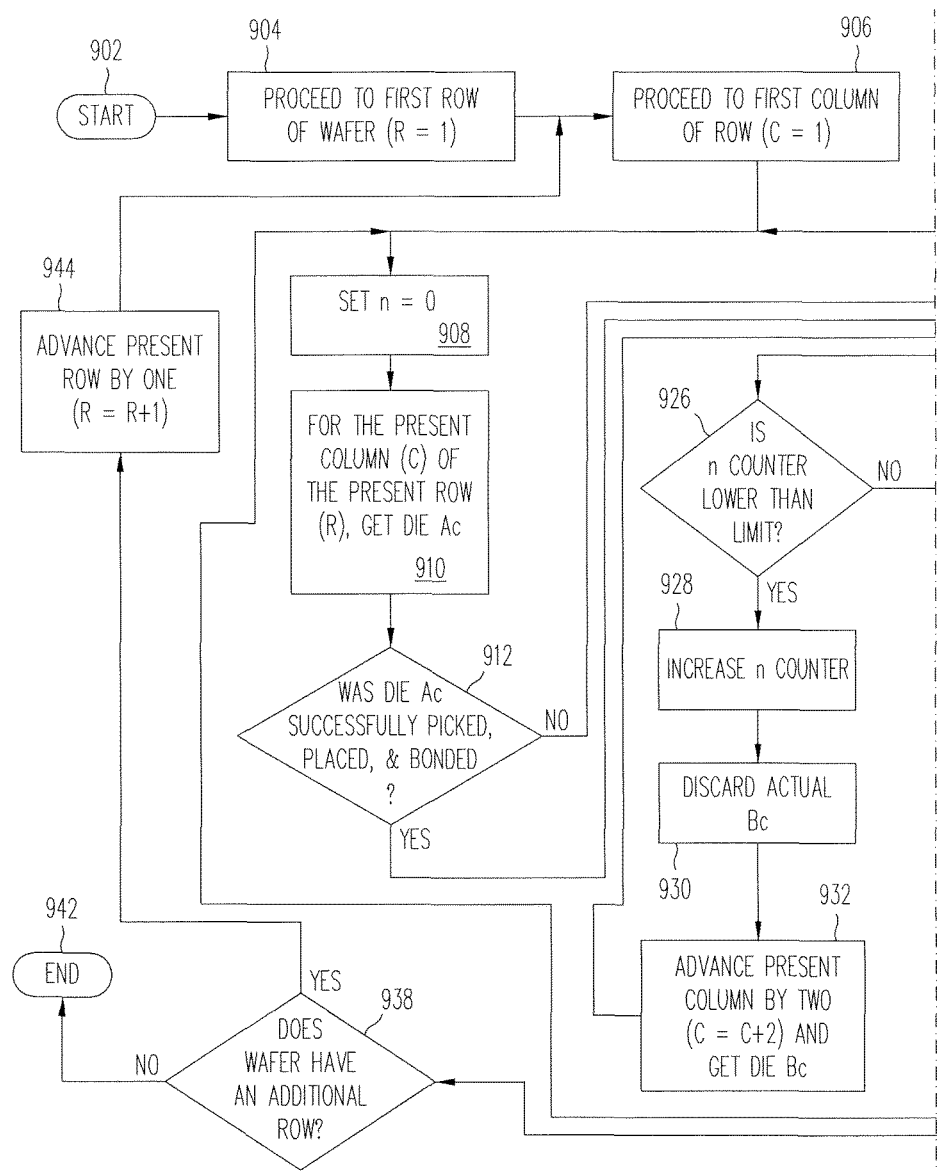
FIG. 9, which includes each of FIG. 9A and FIG. 9B as subparts thereof, is a further flow chart illustrating steps of an example method that is employed as part of the method shown in FIG. 6 (e.g., a subprocess encompassed by the method of FIG. 6) governing the implementation of multiple ones of the dice identified by a map such as that described in accordance with FIGS. 7 and 8 into a circuit or system by a pick and place machine or system such as that of FIGS. 4 and 5, so as to arrive at a circuit or system having multiple matched (or similar) components (e.g., any of those shown in FIGS. 1, 2, and 3)
Figure 9:
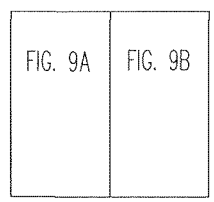

Referring next to FIG. 9, an additional flow chart 900 illustrates steps of an example method or process that can be employed as part of the method or process of FIG. 6 (e.g., a subprocess encompassed by the method of FIG. 6) governing the implementation of multiple ones of the dice 612 identified by a wafer map such as the wafer map 404 described above. For convenience of illustration of the additional flow chart 900 (particularly due to the number steps present in the flow chart), FIG. 9 includes FIG. 9A and FIG. 9B as parts thereof, with some of the steps of the additional flow chart being shown in FIG. 9A and others of the steps of the additional flow chart being shown in FIG. 9B. The method represented by the flow chart 900 of FIG. 9 particularly is performed by a die bonder system such as the die bonder system 420, so as to arrive at a circuit or system having multiple matched or similar components, although in other embodiments other types of systems can be employed such as a pick and place system or die sorting machine. It should be appreciated that the method of FIG. 9 more particularly is performed by, or under the control of, the processor 422 (and the modules 444, 446, and 448 thereof) of the die bonder system 420, in accordance with instructions for performing the process that can be stored in the memory 424 of the die bonder system 420. Further, the method represented by the flow chart 900 can be viewed as constituting (or constituting a part of) the step 620 described above in relation to FIG. 6, and as being performed in accordance with the assembly program 618 of FIG. 6.

As shown, upon commencing at a start step 902, the method of FIG. 9 begins at a step 904 at which the die bonder system 420 proceeds to a first row of a wafer that has been provided to that die bonder system, such as the wafer 402 (for example, in accordance with the step 616 of FIG. 6). That is, the processor 422 of the die bonder system 420 generates and sends to the pick and place head mechanism driver 428 control signals to cause or direct the pick and place head mechanism 432 to move to a first row (R=1) of the wafer 402. The first row can in some cases correspond to a first row as identified in (or during generation of) the wafer map 404, although this need not be the case in all embodiments or circumstances. Typically, the first row for purposes of the method of FIG. 9 will be the first row in which good dice (suitable for implementation) are present, as indicated by the wafer map 404. Next, at a step 906, the die bonder system 420 causes the pick and place head mechanism 432 to proceed to a first column of the first row. In the present embodiment, this would typically be the leftmost column of the first row, although this need not be the case in all embodiments. Also, although the first column (C=1) is the leftmost column of the first row, as already illustrated in regard to FIG. 8, different rows can be of different lengths and extents and so it should be appreciated that the first column of the first row does not necessarily coincide with the first column of subsequent rows of the wafer.

Upon the pick and place head mechanism 432 proceeding to the first column of the first row, the process advances to a step 908 at which a counter "n" is set to an initial value of zero (n=0). As will be described in further detail below, in certain circumstances during operation of the process of FIG. 9, the counter n is used to determine whether dice that are not adjacent to one another can still be implemented as pairs of matched or otherwise similar dice. Next, at a step 910, the processor 422 of the die bonder system 420 causes the pick and place head mechanism 432 to get or obtain a die $A_c$. Often performance of the step 910 entails the processor 422 generating control signals for the pick and place head mechanism driver 428 so as to cause or direct the pick and place head mechanism 432 to attempt to pick up the die $A_c$ from the wafer 402, to move and place that die onto a target circuit or system structure (e.g., the substrate 438), and to bond that die onto that structure. In the present example embodiment, the die $A_c$ is naturally an A-type die because, as already explained with regard to the wafer map 404 corresponding to the wafer 402, the dice on the wafer are arranged as pairs with A-type dice being adjacent to B-type dice, and with the die at the leftmost position of the first row naturally being an A-type die. However, in alternate embodiments the first column of the first row need not be the leftmost column of the first row at which a good die is present, but rather could be another (e.g., rightmost) column.

Next, at a step 912, it is determined whether the die $A_c$ that was gotten or obtained at the step 910 was successfully picked up and placed onto the target circuit or system structure (e.g., the substrate 438), and bonded to that structure. If the picking up, placement of, and bonding of the die $A_c$ was successful, then the method advances from the step 912 to a step 918. At the step 918, the die bonder system 420 causes the pick and place head mechanism 432 to advance the present column by one (C=C+1) such that the pick and place head mechanism moves to the location of a die $B_c$ adjacent to the location of the previously-obtained die $A_c$, to get or obtain that die. This is appropriate in the present example embodiment involving the wafer 402 and the wafer map 404 given that, in this embodiment, there is a B column with B-type dice adjacent (to the right of) each A column with A-type dice. As discussed in relation to the step 910, performance of the step 918 often entails the processor 422 generating control signals for the pick and place head mechanism driver 428 so as to cause or direct the pick and place head mechanism 432 to attempt to pick up the die $B_c$ from the wafer 402, to move and place that die onto a target circuit or system structure (e.g., the substrate 438), and to bond that die onto that structure.

Upon completion of the step 918, the process advances to a step 920, at which is determined whether the die $B_c$ was successfully picked up and placed onto the target circuit or system structure (e.g., the substrate 438), and bonded to that structure. Such a determination can be made by the processor 422 of the die bonder system 420 based upon sensor/input signals received back from the pick and place head mechanism 432 (or from sensors provided on that mechanism). If it is determined at the step 920 that the die $B_c$ was successfully picked up, placed, and bonded, then that signifies that a desired pair of matched or similar dice, namely the die $A_c$ and the die $B_c$, were successfully implemented on the target circuit or system structure (e.g., the substrate 438), and accordingly the process at a step 922 indexes a pad (LF) in a manner that indicates this successful implementation. Further, after the pair of matched or similar A-type and B-type dice (the dice $A_c$ and $B_c$) have been indexed at the step 922, then the method advances to a step 916, at which it is determined whether the current value of the column (C) is at the right edge of the row on the wafer 402, such that no additional potential pairs of A-type and B-type dice are available in that row.

Returning to the steps 912 and 920, in some circumstances it is determined at the step 912 that the die $A_c$ has not been successfully picked, placed, and bonded and, likewise, in some circumstances it is determined at the step 920 that the die $B_c$ has not been successfully picked, placed, and bonded. This can be the case for several reasons including, for example, because the die $A_c$ has been missed or dropped during the performing of the step 910 preceding the step 912, or because the die $B_c$ has been missed or dropped during the performing of the step 918 preceding the step 920. Additionally, as already indicated above in regard to the step 902, it should be appreciated that the performing of the method of FIG. 9 is based at least in part upon the wafer map 404 that is made available to the die bonder system 420 in accordance with the step 616. Accordingly, in the present embodiment, the determinations at the steps 912 and 920 in the present embodiment also can depend upon information obtained from the wafer map 402.

More particularly, with respect to the step 910, the processor 422 as part of this step additionally considers the wafer map 404 to determine if the die $A_c$ is a good die (suitable for implementation). In the event that the die $A_c$ is not a good die, then the getting or obtaining of the die $A_c$ will merely involve the determining based upon the wafer map 404 that the die $A_c$ is actually a bad die (not suitable for implementation), and will not involve any attempt to pick up the die $A_c$. In such circumstance, it will additionally be determined at the step 912 that the die $A_c$ was not successfully picked up, placed, and bonded. Similarly, with respect to the step 918 more particularly, the processor 422 as part of this step additionally considers the wafer map 404 to determine if the die $B_c$ is a good die (suitable for implementation). In the event that the die $B_c$ is not a good die, then the getting or obtaining of the die $B_c$ will merely involve the determining based upon the wafer map 404 that the die $B_c$ is actually a bad die (not suitable for implementation), and will not involve any attempt to pick up the die $B_c$. In such circumstance, it will additionally be determined at the step 920 that the die $B_c$ was not successfully picked up, placed, and bonded.

Notwithstanding the similarity between the steps 910, 912 regarding implementation of the die $A_c$ and the steps 918, 920 regarding implementation of the die $B_c$, the method of FIG. 9 takes different types of paths subsequent to those steps depending upon whether it was the A-type die or the B-type die that was not successfully implemented. With respect to the steps following the step 912 (which are shown in FIG. 9B as being linked to the step 912 of FIG. 9A), if any of the above-described circumstances occur such that it is determined at the step 912 that the die $A_c$ was not successfully picked up, placed, and bonded, then the process advances to a step 914 instead of to the step 918. At the step 914, because the die $A_c$ was not successfully implemented, the die $B_c$ adjacent to the die $A_c$ automatically is discarded and the current value of the column (C) is incremented by one (C=C+1). Then, subsequently, the method advances again to the step 916, at which is determined whether the current value of the column (C) is at the right edge of the wafer 402 such that no additional possible candidates for pairs of matched A-type and B-type dice are available in that row.

In contrast, if any of the above-described circumstances occur such that it is determined at the step 920 that the die $B_c$ was not successfully picked up, placed, or bonded, then the method of FIG. 9 follows a subprocess to determine whether there is another possible B-type die other than the die $B_c$ that can serve as a match to (or be sufficiently similar to) the already-successfully-implemented die $A_c$. More particularly as shown, upon it being determined at the step 920 that the die $B_c$ was not successfully implemented, the method advances to a step 924 at which it is determined whether the presently-identified column is at the right edge of the present row (similar to the determination discussed above in regard to the step 916). If at the step 924 it is determined that the presently-identified column is not at the right edge of the row, then this implies that there remain additional B-type dice remaining within the row that can potentially serve as matched or similar dice relative to the already-implemented die $A_c$, and so the process advances to a step 926.

At the step 926, it is further determined, by the processor 422 of the die bonder system 420, whether the current value of the counter n is lower than a predetermined limit (n<limit). If the current value of the counter n is indeed lower than a predetermined limit, this implies that the presently-identified column is a column at which a possible additional matching or similar B-type die is present. More particularly, if n<limit, this indicates that any B-type die existing at the position of the presently-identified column (and row) is sufficiently physically close to the original position of the already-implemented A-type die (the die $A_c$) on the wafer 402 for that B-type die to be considered matched or similar to that A-type die. If this is the case, then the process advances from the step 926 to a step 928, at which the counter n is increased. In the present embodiment, such an increase can involve incrementing the value of n by one, although in other embodiments other types of increases or changes can be performed by the processor 422. It should be noted that the value of n at any time can be stored in the memory 424 of the die bonder system 420, and also that the predetermined limit can also be stored in that memory. Further, the predetermined limit can take on a variety of values including, for example, three, four, five, etc.

Subsequent to the step 928, the die $B_c$ that was determined to have not been successfully picked, placed or bonded at the step 920 is discarded at a step 930. Then, at a step 932, the die bonder system 420 advances the present column by two (C=C+2) and causes the pick and place head mechanism 432 to move so as to get or obtain the B-type die at that new column location, which constitutes a new die $B_c$. Then the process returns to the step 920, at which it is determined whether the new die $B_c$ was successfully picked up, placed, and bonded.

Similar to as discussed above in regard to the step 918, performance of the step 932 often entails the processor 422 generating control signals for the pick and place head mechanism driver 428 so as to cause or direct the pick and place head mechanism 432 to attempt to pick up the die $B_c$ (the new die $B_c$) from the wafer 402, to move and place that die onto a target circuit or system structure (e.g., the substrate 438), and to bond that die onto that structure. If it is determined at the step 920 that such efforts were successful, then the process advances to the steps 922 and 916 as described above. However, if it is determined at the step 920 that such efforts at implementation were attempted but unsuccessful, then the process returns again to the step 924. Also, the performance of the step 932 can involve consultation of the wafer map 404 to determine whether the new die $B_c$ is a good die (suitable for implementation). If not, the step 920 can involve a determination that the new die $B_c$ was unsuccessfully implemented for this reason, in which case the method also returns again to the step 924.

In view of the above description concerning the steps 920, 924, 926, 928, 930, and 932, it should be appreciated that the process of FIG. 9 can cycle through this series of steps one or more times. This particularly can occur if successive B-type dice of a row for one reason or another are not successfully implemented as determined at the step 920, so long as the right edge of the row has not reached as determined at the step 924, and so long as the value of the counter n remains lower than the predefined limit as determined at the step 926. However, if the value of the counter n reaches the predefined limit as determined at the step 926, then the most recently-obtained B-type die (that is, the die $B_c$ evaluated at the step 920 when most recently performed) was the final B-type die that can potentially be considered matched or similar to the already-implemented A-type die (the die $A_c$ implemented in the step 912 when most recently performed). That is, in such case, the position on the wafer 402 of the most recently-obtained B-type die within the presently-identified row is as far as possible from the position from which the most-recently-implemented die $A_c$ was obtained without the two dice failing to be matched or similar. Further, in such case, even if potentially there exist one or more additional B-type dice to the right of the presently-identified B-type die (die $B_c$), one or more features or characteristics of those additional B-type dice will be too different from the already-implemented A-type die (the die $A_c$ implemented in the step 912 when most recently performed) to be considered a match or sufficiently similar.

If it is determined at the step 926 that the counter n is no longer lower than the predefined limit, then the process advances to a step 934. In this circumstance, it is not possible to implement a die $B_c$ that is sufficiently matched or similar to the already-implemented die $A_c$, and consequently the die bonder system 420 discards the already-implemented die $A_c$ and the index pad (LF) is marked to indicate that the die $A_c$ is unusable. Then further, at a step 936, the processor 422 of the die bonder system 420 determines whether the presently-identified column value C is at the right edge of the presently-identified row.

In view of the above discussion, it can be seen that the process of FIG. 9 can reach any of the steps 916, 924, and 936 at which a determination is made by the processor 422 of the die bonder system 420 as to whether the present value of the column is at the right edge of the wafer 402. In each of these cases, if the present column truly is at the right edge of the wafer 402, then the pick and place head mechanism must advance to a new row in order to continue with implementing dice. Thus, in each of these cases, if it is determined at any of the steps 916, 924, and 936 that the present column is at the right edge of the wafer 402, then the method advances to a step 938, at which it is determined additionally whether the wafer in fact has an additional row. Also in this regard, particularly if it is determined at the step 924 that the present column is at the right edge of the wafer, then in order to proceed from the step 924 to the step 938 the process also performs a further step 940 at which the already-implemented A-type die (the die $A_c$ of the step 912) is discarded and the corresponding pad is indexed (LF).

If at the step 938 it is determined that the present row is the final (e.g., bottom) row of the wafer 402, then the process ends at an end step 942. However, if one or more additional rows are still available with additional A-type and B-type dice, then the process advances from the step 938 to a step 944, at which the present value of the row is advanced by one (R=R+1). Upon completion of the step 944, then the process returns to the step 906, at which the die bonder system 420 causes the pick and place head mechanism 432 to proceed to the first (leftmost) column of the new row (C=1). Given this to be the case, it can be appreciated that the method of FIG. 9, and the corresponding assembly program 618 of FIG. 6, set forth a Z-shaped assembly methodology insofar as dice extending across a row are considered in a left-to-right manner across the row and subsequently, when all dice in that row have been considered, the dice of a new row below the previous row are considered, again in a left-to-right manner. Also it should be appreciated that, because each row can have different numbers of columns corresponding to different widths of each row on the wafer 402, the first column of the new row is not necessarily aligned with the first column of the preceding row as had been determined earlier.

Further, as also illustrated by FIG. 9, if it is determined at any of the steps 916, 924 and 936 that the present column is not at the right edge of the wafer, then the method takes alternative paths depending upon whether the determination was made at the step 916, 924, or 936. As already discussed, if it is determined at the step 924 that the present column is not at the right edge, then the method advances from the step 924 to the step 926, so as to allow for additional B-type dice within the current row to be evaluated as candidates for implementation. Alternatively, if it is determined that the present column is not at the right edge of the wafer 402 at the step 936, then the method advances to a step 946, at which the die bonder system 420 advances the present column by one (C=C+1). Upon completion of the step 946, the method then returns to the step 908 and subsequently the step 910, at which the next successive A-type die within the present row can be obtained. Further alternatively, if it is determined that the present column is not at the right edge of the wafer 402 at the step 916, then the method advances to a step 948, at which the die bonder system 420 also advances the present column by one (C=C+1). Upon completion of the step 948, the process again returns to the step 908 and subsequently the step 910, at which again the next successive A-type die within the current row can be obtained.

Figure 10:
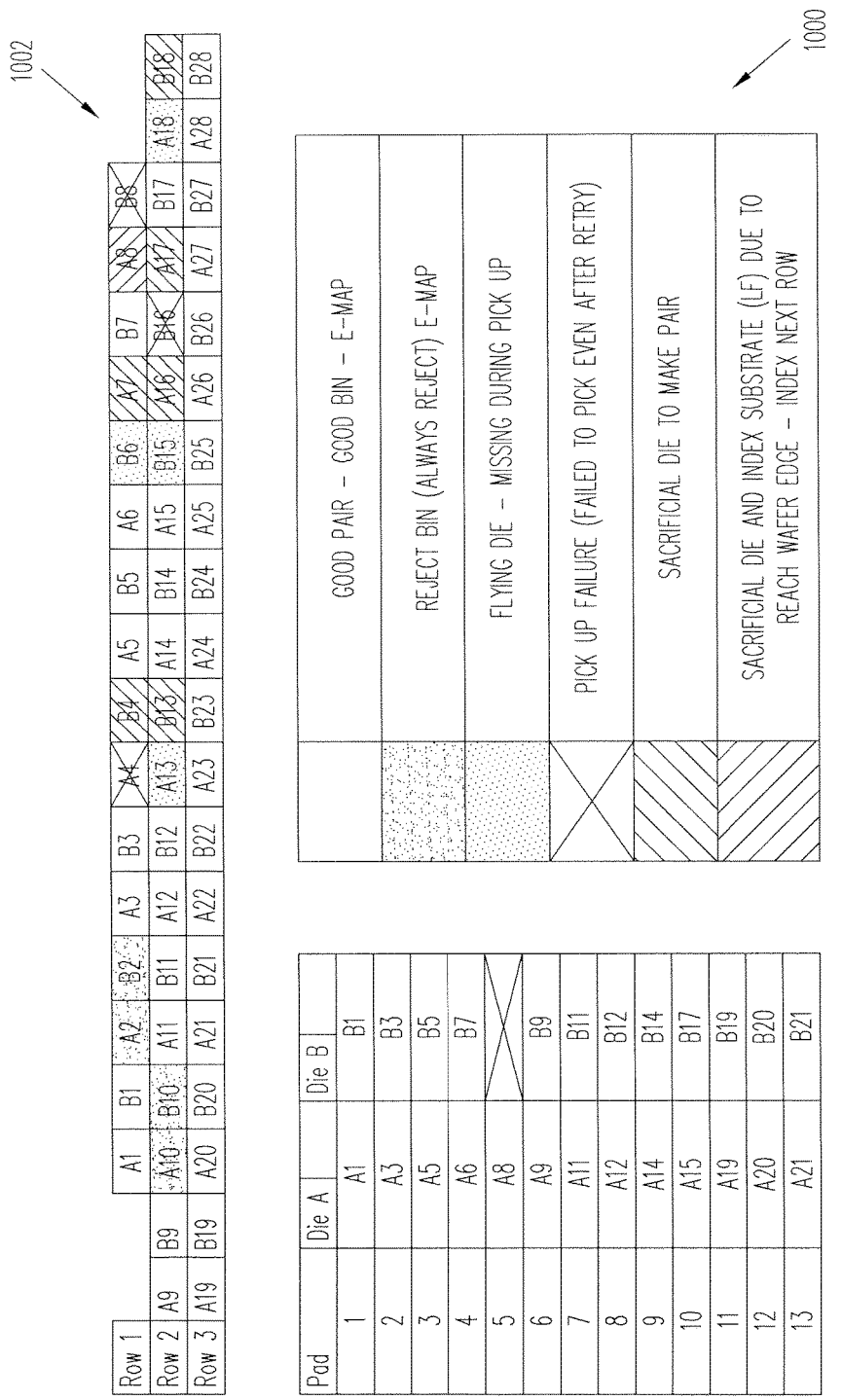
FIG. 10 is a chart showing a portion of a map such as that described in FIG. 8 in relation to a table illustrating how, in an example embodiment, multiple ones of the dice identified in the map are implemented in accordance with operation of the method of FIG. 9.

Referring additionally to FIG. 10, a chart 1000 shows an upper region of an exemplary wafer map 1002 that is similar to the exploded upper region 808 of FIG. 8B, juxtaposed in relation to a table 1004. FIG. 10 particularly is provided to illustrate how, in one example embodiment, multiple ones of the dice identified in the wafer map were implemented on a target circuit or system structure (e.g., the substrate 438) in accordance with the operation of the method of FIG. 9. More particularly, in this example, a first row (row 1) of a wafer represented by the wafer map 1002 included eight pairs of A-type and B-type dice, namely, dice A1, B1 . . . A8, B8. As shown by the table 1004, the first pair of dice A1, B1 were successively implemented on a pad 1 of the target circuit or system structure, as A-type and B-type dice, respectively. However, the second pair of dice A2, B2 were not implemented on any pad of the target circuit or system structure because, according to the probing operations of FIG. 7, these dice were determined to be unsuitable for implementation. That is, although the dice A1, B1 were both determined to be suitable dice according to the probing method of FIG. 7 and successfully implemented in accordance with the assembly method of FIG. 9, the dice A2, B2 were not implemented but rather were discarded in accordance with the steps 910, 912, and 914 of FIG. 9 because the dice were determined to be unsuitable during the probing process of FIG. 7.

Further with reference to FIG. 10, as with the dice A1, B1, the dice A3, B3 were determined to be suitable for implementation by way of the method of FIG. 7 and then were successfully implemented in accordance with the assembly method of FIG. 9, and thus are listed in the table 1004 as being implemented on a pad 2 as the A-type and B-type dice of that pad. However, with the next A-type die A4, it can be seen that with respect to this die there was a pickup failure during the step 910, as determined at the step 912. Because of this, the corresponding B-type die B4 was discarded or sacrificed in accordance with the step 914 of the flow chart 900.

The remaining A-type and B-type dice of the first row shown in the wafer map portion 1002 illustrate additional operational circumstances. The dice A5, B5 again (as with the dice A1, B1 and A3, B3) were evaluated to be suitable for implementation during the probing method of FIG. 7 and were successfully implemented in the circuit or system (or substrate), in this case on a pad 3, as the A-type and B-type dice of that pad. By contrast, although the A6 die was identified during the probing method as being a good die suitable for implementation, as shown the B6 die was not successfully picked up, placed and bonded as determined at the step 920 of the process of FIG. 9. Accordingly, in accordance with the steps 924, 926, 928, 930, and 932 of the flow chart 900 of FIG. 9, because the A6 die was not at the right edge of the wafer, and because the relevant proximity criterion (e.g., n<limit) was satisfied, the next B-type die of the row—namely, the die B7—was implemented as being matched or similar to the A6 die. Correspondingly, in this example, not only was the B6 die not implemented, but also the A7 die A7 was discarded as a sacrificial die (even though it was determined to be a good die during the probing process) to allow for the implementation of the pair of dice A6 and B7 on a pad 4.

As for the final dice A8, B8 of the first row, as shown there was a pickup failure in implementing the B8 die. Thus, in accordance with the steps 920, 924, and 940 of the flow chart 900 of FIG. 9, not only was the B8 die not implemented, but also the A8 die was considered a sacrificial die. However, in this circumstance the target circuit or system structure (e.g., the substrate 438) is shown to have been indexed because of a determination that the right edge of the first row had been reached, in accordance with the steps 924 and 940. Given the indexing, it can be seen in the table 1004 that a pad 5 is shown to have the die A8 implemented as an A-type die, but to be missing any B-type die.

The chart 1000 of FIG. 10 additionally illustrates how additional dice A9, B9 . . . A18, B18 of row 2 and A19, B19 . . . A28, B28 of row 3 were implemented or not implemented, and relatedly illustrates various aspects of the assembly method of the flow chart 900. In these rows 2 and 3, each of several pairs of dice A9, B9, A11, B11, A12, B12, A14, B14, and each of A19, B19 . . . A28, B28 were all good dice according to the wafer map 1002 as determined by the wafer probe system 410 in accordance with the method of FIG. 7. Thus, as shown by the table 1004, several of these pairs of dice were implemented on pads 6, 7, 8, 9, 11, 12, and 13 of the target circuit or system structure (e.g., the substrate 438). Further, as with the dice A2, B2 of the first row, the dice A10, B10 were rejected during the probing operation of FIG. 7 and thus were not implemented at the step 912 of FIG. 9.

As for the dice A13 and A18, each of these is an example of an A-type die that was not successfully implemented as determined at the step 912 (e.g., because it was a flying die or missed during pickup) and consequently, in accordance with the step 914, the dice B13 and B18 that respectively were counterparts to the dice A13 and A18, respectively, were also discarded. Although similar in these respects, it should additionally be appreciated that the method of FIG. 9 would have taken two different paths following the handling of the dice A13, B13 and the dice A18, B18. In particular, following the discarding of the die B13 at the step 914, the die bonder system 420 at the step 916 would have determined that there were still additional dice to the right of the discarded die within the second row and therefore would have proceeded to the step 948 of FIG. 9. In contrast, following the discarding of the die B18 at the step 914, the die bonder system 420 at the step 916 would have recognized that the dice A18, B18 were at the right edge of the wafer and consequently would have proceeded to the step 938 and therefore moved to the third row.

In addition, the dice A15, B15, A16, B16, A17, and B17 of the second row of the wafer map 1002 illustrate a scenario in which non-neighboring dice A15 and B17 were implemented as a pair on a pad 10 of the target circuit or system structure (e.g., the substrate 438). This would have been possible in accordance with operation involving the cycling through of the steps 920, 924, 926, 928, 930, and 932 of FIG. 9, particularly to the extent that the right edge of the row had not yet been reached as determined at the step 924 and to the extent that the value of counter n remained lower than a predetermined limit (n<limit). More particularly, in this example, even though the die B15 was missing during pickup and even though the die B16 was not successfully implemented as determined at the step 920 (and even though correspondingly the dice A16 and A17 were sacrificed), the B-type die B17 was still implemented in relation to the A-type die A15 on the pad 10 of the target circuit or system structure (e.g., the substrate 438). Such operation is consistent with a scenario in which the predefined limit was at least two. For although the dice A15 and B17 were not adjacent to one another within the second row of dice, the A15 and B17 dice were sufficiently close to one another as determined by the proximity criterion (n<limit) that the two dice could be considered matched or sufficiently similar to be implemented.

In view of FIG. 10, and additionally in view of FIGS. 7, 8, and 9, several particular behaviors are exemplified. Among other things, it should be appreciated that if an A-type die is picked and placed and bonded successfully, then the die bonder system 420 should search for the next available B-type die, even if there is a need to index forward to obtain a B-type die that is not adjacent to the implemented A-type die, at least up until the counter n reaches a predetermined limit. Additionally, if an A-type die is picked and placed and bonded successfully and the die bonder system 420 searches for a counterpart B-type die, but the predefined limit of the counter n is reached before such an appropriate B-type die is implemented, then the A-type die will be sacrificed and the substrate (LF) will be indexed (and thus there will be a lost pad). It should be further appreciated that any given A-type die can only be implemented in combination with a counterpart B-type die that is within the same row, that is, there is indexing to the next available B-type die only to extent that it is within the same row as the given A-type die.

Further, it should be appreciated that, if the die bonder system 420 reaches the edge of a wafer, that is, reaches a final available pair of A-type and B-type dice (last pair) and the A-type die of that pair is not available, then the B-type die will be sacrificed and the die bonder system 420 will index to the next row. Such operation is in accordance with the steps 912, 914, 916, 938, and 944 of FIG. 9. Finally, it should further be appreciated that, if the die bonder system 420 reaches the edge of the wafer (last pair) and the A-type die is picked and placed and bonded, but the counterpart B-type die that is directly adjacent to that A-type die is not available, then that A-type die will be sacrificed and the substrate (LF) will be indexed (lost pad). Such operation is in accordance with the steps 912, 918, 920, 924, and 940.

Notwithstanding the description provided above, the present disclosure is intended to encompass numerous other or alternate embodiments in addition to those discussed above. For example, it will be appreciated that the description provided regarding FIG. 7, FIG. 8, FIG. 9, and FIG. 10 envision embodiments in which a wafer is singulated into dice that are of two types that can be implemented as pairs of matched or similar dice, namely, the A-type and B-type dice described above. Yet it should be appreciated that, in alternate embodiments, it can be desired to implement on a target circuit or system structure (or substrate) groups of dice that are matched or similar that include more than two dice, that is, groups of dice that are matched or similar that are larger in extent that than simply pairs of dice (e.g., three dice, four dice, etc.).

It should be further appreciated that, to achieve operation of a system such as the system 400 to fabricate or achieve such circuits or systems that employ groups of dice that are matched or similar that encompass more than two dice (or more than two types of dice), the processes represented by the flow charts 700 and 900 can be modified accordingly. More particularly, with respect to the probing method of FIG. 7, to the extent that it is desired to identify candidates of suitable dice that can be implemented as groups of matched or similar dice encompassing M dice, the step 706 can be modified to probe each of the dice C, C+1 . . . C−1+M. Relatedly, to achieve probing determinations, the step 708 can be modified to determine whether any of the dice at C, C+1 . . . C−1+M is a good die. Further, an additional group of steps paralleling the steps 714, 716, and 722 can be added for each additional die of the set. That is, M−1 additional groups of steps corresponding to the steps 714, 716, and 722 can be performed for each additional group of die that is to be added to each group. Additionally, the step 718 can be modified to determine whether a column C+M exists in the present row and, the step 724 can be modified to advance the present column by M.

As for adjustments to the flow chart 900 of FIG. 9 to accommodate circumstances in which it is desired to implement groups of dice that are matched or similar that encompass more than two dice (or more than two types of dice), similar types of changes can be made to the flow chart as were described above in regard to the flow chart 700 of FIG. 7. For example, to suit circumstances in which there is a desire to implement groups of matched or similar dice encompassing M types of dice, the flow chart 900 can be modified to include additional groups of steps paralleling the steps 918, 920, 924, 926, 928, 930, 932, 934, 936, and 940 for each additional type of die beyond two die that are to be included among the M types of dice. Further, the flow chart 900 can be additionally modified so that, upon it being determined that the second type of die (B-type die) is successfully implemented at the step 920, the process would advance to a counterpart of the step 918 with respect to the next type of die. Further, the flow chart 900 can also be modified so that the incrementing performed at the steps 932 and counterpart steps increase the present column value by M rather than 2, and the incrementing performed at the step 914 increases the present column value by M−1 rather than 1.

Additionally, although in the above-discussed embodiment of FIGS. 7, 8, 9, and 10 it is envisioned that a first type of die (e.g., an A-type die) can only be potentially paired or grouped with a die of another type that is positioned to the right of that first die (for example, with a B-type die that is to the right of the A-type die), this is not necessarily the case in other embodiments. For example, in some alternative embodiments, if an A-type die is skipped, this does not necessitate that the subsequent B-type die be discarded. Rather, even if an A-type die is skipped, in such embodiments, the subsequent B-type die can be implemented as the first die of a new pair (or other group) of dice. For example, referring to the illustration of FIG. 10, in such alternative embodiments it is possible that, even though the A14 die was missed, the B14 die can be implemented on a pad in combination with a subsequent die that would provide the appropriate matching or similarity (e.g., the A15 die).

It should be recognized that the methods and systems encompassed herein for achieving semiconductor circuits or systems having matched or similar components are advantageous in numerous respects. For example, even though conventional techniques for die pairing may exist, such techniques involve multi-pass operation in terms of how dice are picked up and placed onto a substrate or otherwise implemented as part of a system or circuit. Because multi-pass operation is performed, such operation cannot assure, and often fails to provide, desired levels of component matching or similarity. By contrast, one or more of the methods and systems encompassed herein can operate to select and implement dice for implementation into a given system or circuit (e.g., onto a substrate) through one or single-pass operation, and the dice that are implemented much more fully achieve desired levels of component matching or similarity.

Additionally, one or more of the methods and systems encompassed herein can operate to select and implement dice for implementation into a given system or circuit in a manner that achieves desired levels of component matching or similarity while also taking into account, and adjusting to compensate for, real time events (e.g., flying dice, misspicks, dropped dice, etc.). Such operation allows for systems and circuits having components with matched or similar characteristics or features to be manufactured or otherwise achieved in manners that reduce or minimize the loss (or waste) of material and increase or maximize throughput.

It should also be appreciated that the methods and systems encompassed herein allow for semiconductor systems and components to be manufactured or achieved in which the groups of components that are matched or similar can involve groups of two components or groups of more than two (e.g., three, four, or more) components. Accordingly, to provide such groups of components, corresponding groups of two dice or groups of more than two (e.g., three, four, or more) dice, are implemented. All such variations, in terms of the numbers of components and numbers of dice that are implemented are intended to be encompassed herein. Further, it should additionally be appreciated that the systems and circuits having matched or similar components that can be fabricated or otherwise achieved by way of the methods and systems described herein can take on numerous different forms and be implemented in numerous contexts. For example, in at least some embodiments, the systems and circuits having matched or similar components can be suitable for or used in networking systems, automotive applications, and other applications.

Indeed, it should be appreciated that the present invention is intended to encompass numerous different embodiments employing one or more of the various features described herein. As an example, in one aspect the present invention relates to a method of achieving at least one part of a semiconductor system having matched or similar components. The method includes directing a pick and place head mechanism, by way of a processing device associated with an assembly machine, to move to a first position at a first column of a first row of a singulated semiconductor wafer having a plurality of rows including the first row and a plurality of columns including a first set of columns each including a plurality of first dice of a first type and a second set of columns each including a plurality of second dice of a second type, the first set of columns including the first column. The method also includes directing the pick and place head mechanism to implement a first one of the first dice from the first position at a first location on one or more substrates, where the first one of the first dice includes a first component, and determining whether the first one of the first dice was implemented at the first location as directed.

Additionally, the method also includes, subsequent to determining that the first one of the first dice was implemented at the first location as directed, determining that a first one of the second dice is present at a second position at a second column that is also within the first row and that satisfies a proximity criterion indicative of a maximum distance on the wafer that can separate matched or similar dice, the second set of columns including the second column. The method also includes, upon determining that the first one of the second dice is present at the second position at the second column that satisfies the proximity criterion, directing the pick and place head mechanism to implement the first one of the second dice from the second position at the second location, where the first one of the second dice includes a second component that is matched or similar to the first component due to the first and second type being matched or similar. Upon the first one of the first dice and the first one of the second dice being implemented on the one or more substrates, the one or more substrates constitutes or constitute the at least one part of the semiconductor system having the matched or similar components, the matched or similar components including the first and second components.

Also for example, in at least one additional aspect, the present invention relates to a method of achieving at least one part of a semiconductor system having matched or similar components. The method includes directing a wafer probe, by way of a first processing device, to move to an initial position at an initial column of an initial row of a singulated semiconductor wafer, the wafer having a plurality of rows including the initial row, and a plurality of columns including a first set of columns each including a plurality of first dice of a first type and a second set of columns each including a plurality of second dice of a second type, the first set of columns including the initial column. The method additionally includes determining, based upon at least one signal communicated to or from the wafer probe in relation to an initial one of the first dice at the initial position, whether the initial one of the first dice is suitable for being implemented, and storing in a wafer map initial information regarding whether the initial one of the first dice is suitable for being implemented. The method further includes directing the wafer probe to a plurality of additional positions within the first row and subsequently in one or more additional rows of the plurality of rows, determining based upon one or more additional signals communicated to or from the wafer probe in relation to additional ones of the first and second dice at the additional positions whether the additional ones of the first and second dice are suitable for being implemented, and storing in the wafer map additional information regarding whether the additional ones of the first and second dice are suitable for being implemented.

Additionally, the method also includes directing a pick and place head mechanism, by way of either the first processing device or a second processing device, to implement a first one of the first dice from a first position along a first row of the plurality of rows at a first location on one or more substrates, where the first one of the first dice includes a first component. The method also includes, upon determining that the first one of the first dice was implemented at the first location as directed, directing the pick and place head mechanism to implement a first one of the second dice from a second position along the first row at a second location on the one or more substrates, where the second one of the first dice includes a second component. The method further includes causing the pick and place head mechanism to skip attempting to implement a second one of the first dice or a second one of the second dice at a further position along the first row on the one or more substrates, based upon at least some of the initial and additional information stored in the wafer map indicating that the second one of the first dice or the second one of the second dice is not suitable for being implemented. Upon the first one of the first dice and the first one of the second dice being implemented on the one or more substrates, the one or more substrates constitutes or constitute the at least one part of the semiconductor system having the matched or similar components, the matched or similar components including the first and second components.

Further for example, in at least one additional aspect, the present invention relates to a system for achieving at least one part of a semiconductor system having matched or similar components. The system includes a processing device that includes first circuitry configured to generate control signals that at least indirectly cause a pick and place head mechanism to move to a plurality of positions in succession within a first row of a singulated semiconductor wafer at which are positioned a plurality of first dice of a first type and a plurality of second dice of a second type, the first dice and second dice being arranged in an alternating manner at the plurality of positions along the first row, with a first one of the first dice being positioned at a first of the positions, and to attempt to pick up and place, in relation to one or more substrates, at least some of the first dice and second dice. Additionally, the processing device includes second circuitry that is configured to assess whether attempts to implement one or more of the first and second dice in relation to the one or more substrates should be skipped based upon wafer map information concerning whether the first dice and the second device are suitable for being implemented. Further, the processing device includes third circuitry that is configured to determine whether a second position of the plurality of positions of a first one of the second dice is sufficiently proximate to the first position so that it would be appropriate to implement the first one of the second dice on the one or more substrates subsequent to the first one of the first dice being implemented on the one or more substrates so as to provide thereon the matched or similar components.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A method of achieving at least one part of a semiconductor system having matched or similar components, the method comprising:
   directing a pick and place head mechanism, by way of a processing device associated with an assembly machine, to move to a first position at a first column of a first row of a singulated semiconductor wafer having a plurality of rows including the first row and a plurality of columns including a first set of columns each including a plurality of first dice of a first type and a second set of columns each including a plurality of second dice of a second type, the first set of columns including the first column;
   directing the pick and place head mechanism to implement a first one of the first dice from the first position at a first location on one or more substrates, wherein the first one of the first dice includes a first component;
   determining whether the first one of the first dice was implemented at the first location as directed;
   subsequent to determining that the first one of the first dice was implemented at the first location as directed, determining that a first one of the second dice is present at a second position at a second column that is also within the first row and that satisfies a proximity criterion indicative of a maximum distance on the wafer that can separate matched or similar dice, the second set of columns including the second column; and
   upon determining that the first one of the second dice is present at the second position at the second column that satisfies the proximity criterion, directing the pick and place head mechanism to implement the first one of the second dice from the second position at the second location, wherein the first one of the second dice includes a second component that is matched or similar to the first component due to the first and second type being matched or similar;
   wherein, upon the first one of the first dice and the first one of the second dice being implemented on the one or more substrates, the one or more substrates constitutes or constitute the at least one part of the semiconductor system having the matched or similar components, the matched or similar components including the first and second components.

2. The method of claim 1, further comprising:
   directing the pick and place head mechanism to implement a second one of the second dice from a third position at a third column of the first row to the second location on the one or more substrates, the second set of columns including the third column, wherein the determining that the first one of the second dice is present at the second position occurs after a determination that the second one of the second dice was not implemented at the second location as directed.

3. The method of claim 2, further comprising, subsequent to the determination that the second one of the second dice was not implemented at the second location as directed, and prior to the determining that the first one of the second dice is present at the second position that satisfies the proximity criterion:
  determining that a third one of the second dice is present at a fourth position at a fourth column that is also within the first row and that satisfies the proximity criterion;
  directing the pick and place head mechanism to implement the third one of the second dice from the fourth position at the second location on the one or more substrates; and
  determining that the third one of the second dice was not implemented at the second location as directed.

4. The method of claim 2, further comprising:
  upon determining that either the second position or a fourth position is at or proximate to an edge of the wafer, directing the pick and place head mechanism to move to a fifth position at a first column of a second row.

5. The method of claim 4, further comprising:
  directing the pick and place head mechanism to implement a second one of the first dice from a sixth position at a fourth column of the first row at a third location on a first substrate of the one or more substrates, or a second substrate of the one or more substrates;
  determining that the second one of the first dice was implemented at the third location as directed;
  upon determining that the second one of the first dice was implemented at the third location as directed, directing the pick and place head mechanism to implement a third one of the second dice from the fourth position at a fourth location on the first substrate or the second substrate;
  wherein subsequently the pick and place head mechanism is directed to move to the fifth position when the fourth position is determined to be at or proximate to the edge of the wafer, and correspondingly the second of the first dice is discarded.

6. The method of claim 2,
  wherein the third column is to the right of the first column in the first row, wherein the second column is to the right of the third column in the first row,
  wherein, if a left-to-right axis on the wafer is considered a horizontal axis and an additional axis perpendicular to the left-to-right axis is considered a vertical axis, then the second row extends, below the first row, parallel to the first row, and
  wherein a succession of directions to the pick and place head mechanism concerning movements within the first and second rows cause the pick and place head mechanism to follow a substantially Z-shaped path across the wafer.

7. The method of claim 1, further comprising:
  directing the pick and place head mechanism to implement a second one of the first dice from a third position at a third column of the first row at a third location on a first substrate of the one or more substrates, or a second substrate of the one or more substrates;
  upon determining that the second one of the first dice was not implemented at the third location as directed, discarding a second one of the second dice that is present at a fourth position at a fourth column of the first row that is neighboring the third column, and additionally either:
  directing the pick and place head mechanism to implement a third one of the first dice from a fifth position at a fifth column of the first row; or
  upon determining that either the third position or the fourth position is at or proximate to an edge of the wafer, directing the pick and place head mechanism to move to a sixth position at a first column of a second row.

8. The method of claim 1, further comprising:
  directing the pick and place head mechanism to implement a second one of the first dice from a third position at a third column of the first row at a third location on a first substrate of the one or more substrates, or a second substrate of the one or more substrates; and
  upon determining that the second one of the first dice was implemented at the third location as directed, further determining that a third one of the second dice that is present at a fourth position at a fourth column that is also within the first row fails to satisfy the proximity criterion and causing the second one of the first dice to be discarded.

9. The method of claim 1, further comprising:
  receiving the wafer from a wafer probe system; and
  receiving a wafer map from the wafer probe system, the wafer map specifying which of the first dice and the second dice are suitable for being implemented, and
  wherein the second column is either to the right of the first column or to the left of the first column as determined relative to the first row.

10. The method of claim 1, wherein the plurality of columns additionally includes at least one additional set of columns, wherein each additional set of columns has a respective additional plurality of additional dice of a respective additional type, and the matched or similar components include, in addition to the first and second components, at least one additional component provided on the one or more substrates due to an implementing of at least one of the additional dice onto the one or more substrates by the assembly machine.

11. The method of claim 1, wherein the one or more substrates include one or more substrates selected from a flange, a printed circuit board (PCB), a carrier tape, a waffle pack, a JEDEC tray, and a film frame.

12. The method of claim 1 wherein, when the pick and place head mechanism is directed to implement the first one of the second dice from the second position at the second location, the pick and place head mechanism is directed to implement the first one of the second dice so as to have a second die rotational position on the one or more substrates that is aligned with a first die rotational position on the one or more substrates of the first one of first dice at the first location.

13. The method of claim 1 wherein, when the pick and place head mechanism is directed to implement the first one of the second dice from the second position at the second location, the pick and place head mechanism is directed to implement the first one of the second dice so as to have a second die rotational position on the one or more substrates that is substantially perpendicular with a first die rotational position on the one or more substrates of the first one of first dice at the first location.

14. The method of claim 1, wherein either each of the first dice is identical or substantially similar to each of the second dice, or the first dice differ from the second dice in that each of the first dice has a first size that is smaller or larger than a second size of each of the second dice.

15. The method of claim 1, wherein the first and second components constitute the matched or similar components at least because the first component and the second component are identical or substantially similar in terms of sharing in common one or more of a dielectric thickness, a breakdown voltage, an on-resistance parameter, or another parameter.

16. A method of achieving at least one part of a semiconductor system having matched or similar components, the method comprising:
- directing a wafer probe, by way of a first processing device, to move to an initial position at an initial column of an initial row of a singulated semiconductor wafer, the wafer having a plurality of rows including the initial row, and a plurality of columns including a first set of columns each including a plurality of first dice of a first type and a second set of columns each including a plurality of second dice of a second type, the first set of columns including the initial column;
- determining, based upon at least one signal communicated to or from the wafer probe in relation to an initial one of the first dice at the initial position, whether the initial one of the first dice is suitable for being implemented, and storing in a wafer map initial information regarding whether the initial one of the first dice is suitable for being implemented;
- directing the wafer probe to a plurality of additional positions within the first row and subsequently in one or more additional rows of the plurality of rows, determining based upon one or more additional signals communicated to or from the wafer probe in relation to additional ones of the first and second dice at the additional positions whether the additional ones of the first and second dice are suitable for being implemented, and storing in the wafer map additional information regarding whether the additional ones of the first and second dice are suitable for being implemented;
- directing a pick and place head mechanism, by way of either the first processing device or a second processing device, to implement a first one of the first dice from a first position along a first row of the plurality of rows at a first location on one or more substrates, wherein the first one of the first dice includes a first component;
- upon determining that the first one of the first dice was implemented at the first location as directed, directing the pick and place head mechanism to implement a first one of the second dice from a second position along the first row at a second location on the one or more substrates, wherein the second one of the first dice includes a second component, and
- causing the pick and place head mechanism to skip attempting to implement a second one of the first dice or a second one of the second dice at a further position along the first row on the one or more substrates, based upon at least some of the initial and additional information stored in the wafer map indicating that the second one of the first dice or the second one of the second dice is not suitable for being implemented,
- wherein, upon the first one of the first dice and the first one of the second dice being implemented on the one or more substrates, the one or more substrates constitutes or constitute the at least one part of the semiconductor system having the matched or similar components, the matched or similar components including the first and second components.

17. The method of claim 16, wherein the wafer probe is comprised by a wafer probe system having the first processing device, and the pick and place head mechanism is comprised by an assembly machine having the second processing device.

18. The method of claim 16, further comprising:
- directing the pick and place head mechanism to implement a third one of the first dice from a third position along the first row at a third location on the one or more substrates;
- upon determining that the third one of the first dice was implemented at the third location as directed, directing the pick and place head mechanism to implement a third one of the second dice from a fourth position along the first row at a fourth location on the one or more substrates; and
- upon determining that the third one of the second dice was not implemented as directed at the fourth location, determining that a fourth one of the second dice satisfying a proximity criterion is available for implementation and directing the pick and place head mechanism to implement the fourth one of the second dice at the fourth location.

* * * * *